United States Patent
Davis

(10) Patent No.: US 9,852,843 B2
(45) Date of Patent: Dec. 26, 2017

(54) METHOD AND APPARATUS FOR ADJUSTABLE COUPLING FOR IMPROVED WIRELESS HIGH Q RESONANT POWER TRANSFER

(71) Applicant: QUALCOMM Incorporated, San Diego, CA (US)

(72) Inventor: Roy Howard Davis, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 724 days.

(21) Appl. No.: 14/330,569

(22) Filed: Jul. 14, 2014

(65) Prior Publication Data

US 2016/0012966 A1     Jan. 14, 2016

(51) Int. Cl.
*H02J 17/00* (2006.01)
*H01F 38/14* (2006.01)
(Continued)

(52) U.S. Cl.
CPC ............ *H01F 38/14* (2013.01); *B60L 11/182* (2013.01); *B60L 11/1824* (2013.01); *H02J 5/005* (2013.01); *H04B 5/0037* (2013.01); *H04B 5/0075* (2013.01); *B60L 2230/10* (2013.01); *H02J 7/025* (2013.01); *H03J 2200/35* (2013.01); *Y02T 10/7005* (2013.01); *Y02T 10/7088* (2013.01); *Y02T 90/12* (2013.01); *Y02T 90/121* (2013.01); *Y02T 90/122* (2013.01); *Y02T 90/14* (2013.01)

(58) Field of Classification Search
CPC .................................. H02J 50/12; H02J 50/50
See application file for complete search history.

(56) References Cited

U.S. PATENT DOCUMENTS 8,653,698 B2   2/2014  Baarman et al.
2010/0201316 A1   8/2010  Sakoda et al.
(Continued)

FOREIGN PATENT DOCUMENTS

WO   WO-2013142840 A1   9/2013

OTHER PUBLICATIONS

International Search Report and Written Opinion—PCT/US2015/033263—ISA/EPO—Sep. 10, 2015.

*Primary Examiner* — Daniel Cavallari
(74) *Attorney, Agent, or Firm* — Knobbe, Martens, Olson & Bear, LLP

(57) ABSTRACT

Methods and apparatuses for wireless inductive power transfer are described herein. One implementation may include an apparatus for wireless inductive power transfer. The apparatus comprises a primary resonator configured to wirelessly transfer power to a secondary resonator coupled to a load of a wireless power receiver. The apparatus comprises a coupling circuit configured to couple energy from a source power supply to the primary resonator. The apparatus comprises a controller configured to coordinate an adjustment of a first amount of coupling between the source power supply and the primary resonator, via the coupling circuit, with an adjustment of a second amount of coupling between the secondary resonator and the load of the wireless power receiver. The coupling circuit comprises a first coupling loop comprising a plurality of segments, each configured to be selectively electrically connected to the source power supply, the first coupling loop electrically isolated from the primary resonator.

9 Claims, 18 Drawing Sheets

(51) Int. Cl.
  *B60L 11/18*  (2006.01)
  *H02J 5/00*  (2016.01)
  *H04B 5/00*  (2006.01)
  *H02J 7/02*  (2016.01)

(56) References Cited

U.S. PATENT DOCUMENTS

| | | |
|---|---|---|
| 2012/0153739 A1 | 6/2012 | Cooper et al. |
| 2012/0217818 A1 | 8/2012 | Yerazunis et al. |
| 2013/0038282 A1 | 2/2013 | Shimokawa |
| 2013/0049484 A1 | 2/2013 | Weissentern et al. |
| 2013/0119773 A1* | 5/2013 | Davis |
| 2013/0313893 A1* | 11/2013 | Ichikawa ............... H02J 17/00 307/9.1 |
| 2014/0054975 A1 | 2/2014 | Shijo et al. |

* cited by examiner

METHOD AND APPARATUS FOR ADJUSTABLE COUPLING FOR IMPROVED WIRELESS HIGH Q RESONANT POWER TRANSFER

FIELD

The described technology generally relates to wireless power. More specifically, the disclosure is directed to methods and apparatuses for adjustable coupling for improved wireless high Q resonant power transfer.

BACKGROUND

Modern portable electronics devices have become more capable, including higher performance battery power sources while consuming lower power. Due to this enhanced capability and always-on availability, consumers have come to depend on portable electronics devices (e.g., telephones and computers) for all manner of tasks. Because consumers are accustomed to continuous availability of devices, it is desirable that associated batteries be wirelessly rechargeable. Inductive wireless power transfer has become the preferred solution for providing wireless power. Similarly, battery powered electric vehicles are becoming more popular as a solution to counteract rising levels of air pollution and the depletion of fossil fuels. One roadblock to further market penetration of electric vehicles is a requirement of routinely connecting a heavy power cable to the vehicle. Wireless charging by inductive power transfer is the preferred solution for stationary charging and the only solution for charging on-the-go. Inductive power transfer is improved by resonating coupled inductors in the power transmitter and the power receiver. In addition, highly resonant inductors are able to couple power over longer distance and do so more efficiently. Accordingly, methods and apparatuses for adjustable coupling for improved wireless highly resonant inductive power transfer are desired.

SUMMARY

An apparatus for wireless inductive power transfer is provided. The apparatus comprises a primary resonator configured to wirelessly transfer power to a secondary resonator coupled to a load of a wireless power receiver. The apparatus comprises a coupling circuit configured to couple energy from a source power supply to the primary resonator. The apparatus comprises a controller configured to coordinate an adjustment of a first amount of coupling between the source power supply and the primary resonator, via the coupling circuit, with an adjustment of a second amount of coupling between the secondary resonator and the load of the wireless power receiver.

A method for wireless inductive power transfer is provided. The method comprises wirelessly transferring power from a primary resonator of a wireless power transmitter to a secondary resonator coupled to a load of a wireless power receiver. The method comprises adjusting a first amount of coupling between a source power supply and the primary resonator via a coupling circuit configured to couple energy from the source power supply to the primary resonator, wherein the adjusting the first amount of coupling is coordinated with an adjustment of a second amount of coupling between the secondary resonator and the load.

An apparatus for wireless inductive power transfer is provided. The apparatus comprises means for generating a wireless field configured to wirelessly transfer power to means for wirelessly receiving the power, the means for wirelessly receiving the power coupled to a load of a wireless power receiver. The apparatus comprises means for coupling energy from a source power supply to the means for generating the wireless field. The apparatus comprises means for coordinating an adjustment of a first amount of coupling between the source power supply and the means for generating the wireless field, via the means for coupling energy, with an adjustment of a second amount of coupling between the means for wirelessly receiving the power and the load of the wireless power receiver.

An apparatus for receiving wireless power inductively is provided. The apparatus comprises a secondary resonator configured to wirelessly receive power from a primary resonator of a wireless power transmitter. The apparatus comprises a coupling circuit configured to couple energy from the secondary resonator to a load. The apparatus comprises a controller configured to coordinate an adjustment of a second amount of coupling between the secondary resonator and the load, via the coupling circuit, with an adjustment of a first amount of coupling between a source power supply and the primary resonator of the wireless power transmitter.

A method for inductively receiving power wirelessly is provided. The method comprises wirelessly receive power from a primary resonator of a wireless power transmitter. The method comprises adjusting a second amount of coupling between a secondary resonator and a load via a coupling circuit configured to couple energy from the secondary resonator and the load, wherein the adjusting the second amount of coupling is coordinated with an adjustment of a first amount of coupling between a source power supply and the primary resonator.

An apparatus for receiving wireless power inductively is provided. The apparatus comprises means for receiving power from means for generating a wireless field of a wireless power transmitter. The apparatus comprises means for coupling energy from the means for receiving power to a load. The apparatus comprises means for coordinating an adjustment of a second amount of coupling between the means for receiving power and the load, via the means for coupling energy, with an adjustment of a first amount of coupling between a source power supply and the means for generating the wireless field of the wireless power transmitter.

Figure 1:
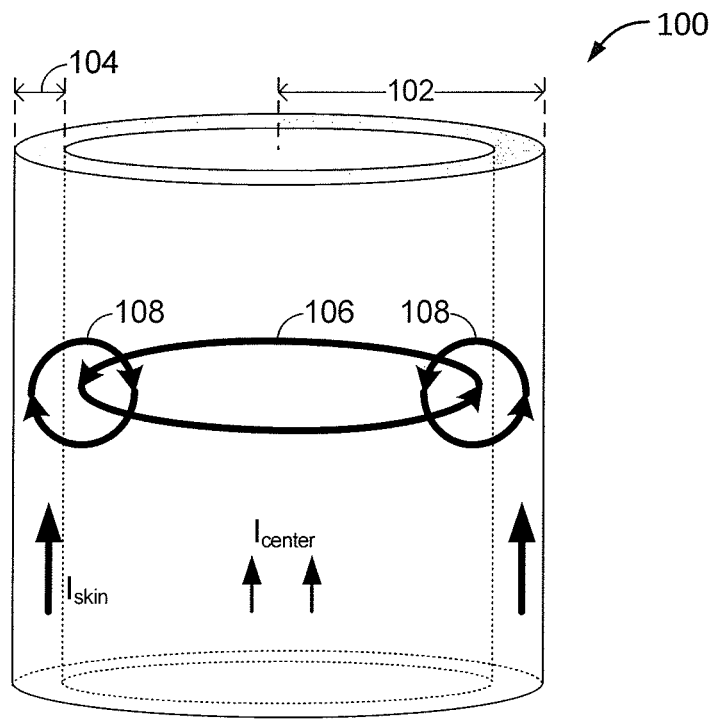
FIG. 1 illustrates an exemplary inductor coil wire in which skin effect may be observed.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of certain implementations of the invention and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the disclosed implementations. In some instances, some devices are shown in block diagram form.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) by a "transmit antenna" or "primary resonator" may be received, captured by, or coupled to a "receive antenna" or "secondary resonator" to achieve power transfer.

Using highly resonant, or high "quality factor" (i.e. Q), resonators enables the energy injected into the primary coil to recirculate and build the magnetic field far beyond what is possible with a non-resonant primary coil. Similarly, a high Q secondary resonator may capture more of the magnetic field and turn it into useful power than a low Q secondary resonator. However, difficulty has been experienced in efficiently coupling energy into the primary resonator, coupling energy efficiently between the primary and secondary resonators, and coupling energy efficiently out of the secondary resonator while maintaining and stabilizing the high operating Q of the system.

The present application describes how the coordinated adjustment of coupling between the elements of the system (e.g., between a power source and a primary resonator, between the primary resonator and the secondary resonator, and between the secondary resonator and a load) may be achieved in response to variation of the distance over which power is to be transferred as well as in response to variation of the load, both of which may change the optimum operating point of the system. For example, as distance and Q are increased, the optimum operating point becomes more and more critical and difficult to stabilize without adjustment of coupling at both the primary resonator and the secondary resonator in a coordinated manner. To begin, a discussion of Q follows.

Q is a unit-less quantity used for many engineering purposes including but not limited to the quality of a component, the energy storage capability of a resonator (e.g., electrical, mechanical or physical) and the frequency selectivity of a circuit. Q is the ratio of desirable qualities to undesirable qualities of a particular circuit. More specifically, Q is the ratio of stored energy (e.g., good stuff) to dissipated energy (e.g., bad stuff) in a particular resonating system. Q may also be defined as the ratio of reactance (e.g., good stuff) to effective resistance (e.g., bad stuff) of inductors or capacitors.

Examples of physical resonators may include whistles, string instruments, swinging pendulums, and ringing bells. For example, in a whistle, sound is produced when air flows past an opening and the air pressure or air flow begins to oscillate. The frequency of the tone is determined by the size and shape of the whistle. A trumpet is another example of a physical resonator where valves vary the air path to produce notes at different frequencies. Likewise, string instruments use mechanical vibrations to produce sound. Longer strings produce low notes when plucked, as compared to shorter strings, which produce higher notes when plucked. Pendulums provide yet another example of physical resonators. A pendulum is made up of a weight hanging on a long rod that is free to swing back and forth. Similar to a string, a longer rod gives the pendulum a longer period, or lower frequency, of oscillation. As the pendulum weight is displaced to one side it is raised, which imparts potential energy to the weight. When the weight swings back toward the center, the potential energy is converted to kinetic energy. As the pendulum weight swings through center to the other side, the kinetic energy is converted back to potential energy. Thus, as the pendulum swings, it continuously converts energy back and forth between potential energy and kinetic energy. From the more familiar physical resonators, our discussion may transition to electrical resonators. In electrical circuits, inductors and capacitors are used to control oscillations instead of air columns, strings or pendulums as in the above-mentioned physical resonators. According to the theory of electromagnetic induction, an electrical current in a wire induces a magnetic field around the wire and a magnetic field cutting across a wire induces an electrical current in the wire. Inductors are coils of wire that store energy in a magnetic field. An inductor opposes changes in current flowing through it. For this reason, the current waveform through an inductor lags behind the voltage waveform by 90° (e.g., ¼ cycle). Inductors having more turns of wire or larger turns have more inductance. In practice, the wire is often wound around a core material containing iron, which concentrates the magnetic lines of flux and increases the inductance for a given cross section and number of turns. A perfect inductor would store energy in a magnetic field with no losses. However, the wire in real-world inductors has a resistance. In addition, if the inductor includes a core material containing iron, there are additional losses associated with eddy currents and hysteresis within the core. Typically an inductor used in a power circuit exhibits inductive reactance at least a factor of 100 greater than the loss due to resistance at the operating frequency. In other words, the unloaded or intrinsic Q is greater than 100 for practical systems. The issue of loss in inductors becomes important in the discussion of wireless power.

Capacitors comprise parallel conductive plates separated by an insulator. Capacitors store energy in an electric field between the plates. Where an inductor opposes changes in current flowing through it, a capacitor opposes changes in voltage impressed across its plates. For this reason, the current waveform through a capacitor leads the voltage waveform by 90° (e.g., ¼ cycle). Larger plates and closer spacing between the plates increase the capacitance. In addition, the insulator, or dielectric, between the plates may increase the capacitance by allowing the plates to store more electric charge for a given plate cross section and separation. Capacitors have losses due to the resistance of the plates as well as the dielectric material, which dissipates a portion of the electric field. In practical wireless power circuits, the losses in the inductors usually dominate the losses in the capacitors. Thus, inductors generally define the performance of a circuit. If the direct current (DC) resistance $r_{dc}$ of the wire in an inductor were representative of the loss, then using heavy, pure copper wire could minimize the loss. However, at higher frequencies, where inductive coupling over a distance is practical, a phenomenon called "skin effect" becomes important. Specifics of high frequency loss in wire can be found in "The Influence of Frequency upon the Self-Inductance of Coils" (August 1906), Bulletin of the Bureau of Standards, vol. 2, 275-296, 1906, Scientific Paper 37.

Figure 2:
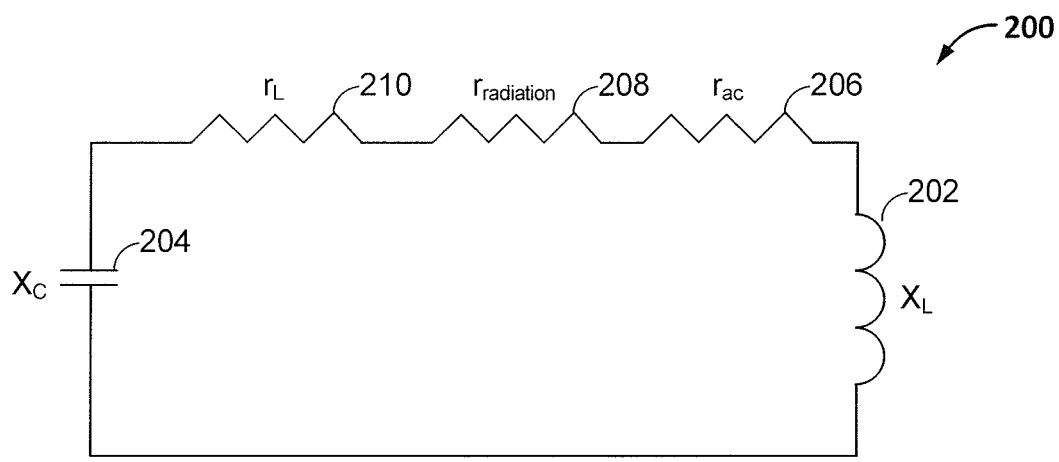
FIG. 2 illustrates an exemplary model of an electrical resonator.

FIG. 1 illustrates an exemplary inductor coil wire 100 in which skin effect may be observed. Alternating current in a wire 100 creates an alternating magnetic field 106 within and around the wire at right angles to the alternating current according to the "right hand rule." The magnetic field 106 in turn induces eddy currents 108 in the wire at right angles to the magnetic field, again, according to the "right hand rule." These eddy currents 108 oppose the flow of current in the middle of the wire $I_{center}$, forcing the current to flow near the surface of the wire $I_{skin}$. This skin effect forces high frequency current to flow only near the outer surface of the wire, which reduces the effective cross-section (e.g., gray shaded region) of the wire 100 and thus increasing the resistance. The depth below the surface of the conductor at which the current density has fallen to approximately 37% of the maximum (e.g., the value at the surface of the conductor) is known as the "skin depth" 104. Due to this skin effect, more than 98% of the current will flow within a depth of 4 times the skin depth from the surface of the conductor. Skin effect increases with increasing frequency. For example, at 100 kHz (e.g., a frequency commonly used for high power electric vehicle charging), the skin depth for copper wire is approximately 0.2 mm. Thus, nearly all of the current will flow in the outer 0.8 mm of a large gauge wire at 100 kHz. This greatly increases the resistance of the wire. For this reason, $r_{dc}$ is not useful in resonance calculations. Accordingly, in practice, high power wireless power transfer applications utilize Litz wire where many smaller gauge insulated wires are wound in parallel and woven from the inside of the bundle to the outside so that each wire has the same fraction of length on the inside as every other wire, minimizing skin depth losses. FIG. 2 illustrates an exemplary model of an electrical resonator 200. Extensive background and design information for L-C resonators can be found in Radio Instruments and Measurements, U.S. Department of Commerce, National Bureau of Standards, Circular C74.

The electrical resonator 200 is formed when an inductor 202 is connected to a capacitor 204. The L-C resonator 200 is often called a "tank circuit" because it stores energy. Once energy is introduced into an L-C resonator 200, the energy builds up in the magnetic field of the inductor 202 while the electric field of the capacitor 204 is depleted, then the cycle reverses and the magnetic field collapses, causing the energy to be built up in the electric field of the capacitor 204. At resonance the inductive reactance of the inductor 202 ($X_L$) and the capacitive reactance of the capacitor 204 ($X_C$) are equal in magnitude and opposite in phase displacement. This is a special feature of operation of an L-C resonator at resonance that causes the voltage and current in the resonator to be in phase with one another. This resonance action is analogous to the pendulum as previously described. However, instead of alternation of potential and kinetic energy of the pendulum, the electrical resonator alternates energy storage in the magnetic field of the inductor and the electric field of the capacitor. As with the pendulum, the flow of energy back and forth in the L-C resonator can continue for long after the initial energy is injected into the resonator. In the pendulum example the loss that eventually slows the weight is air resistance. In a practical L-C resonator, the largest loss is in the AC resistance ($r_{ac}$) of the inductor wire, which may be modeled by the resistance 206 in FIG. 2. The model of the L-C resonator 200 may also include a resistance 208 ($r_{radiation}$), to account for radiation losses due to far field electromagnetic (EM) wave propagation, as well as a resistance 210 ($r_L$) to account for the load. However, as will be explained in greater detail below, $r_{radiation}$ is extremely small in comparison to $r_{ac}$ for resonant inductive power transfer applications and so, for the present discussion, it may be ignored. Since the discussion is currently focused on component Q, the load resistance 210 ($r_L$) may also be ignored for the present discussion.

Since the quality of the components is very important to the operation of the resonance circuit 200, the measure Q is used. Component Q is defined as the ratio of the reactance of the inductor 202 ($X_L$) or the capacitor 204 ($X_C$), to $r_{ac}$ (where $r_{ac}$ is the AC resistance of the component for which Q is being measured or calculated). As previously stated, the inductive or capacitive reactance is the "good stuff" because it contributes to the energy stored in the resonator 200, while $r_{ac}$ is the "bad stuff" because it contributes to the energy lost as heat in the resonator components. The component Q may be calculated according to Equations 1 and 2 below.

$$Q_L = X_L/r_{ac} \text{ component } Q_L \text{ of an inductor} \qquad \text{EQ. 1}$$

$$Q_C = X_C/r_{ac} \text{ component } Q_C \text{ of a capacitor} \qquad \text{EQ. 2}$$

Typical component Q values for inductors used in wireless power transfer may be between approximately 100 and 500 for the highest quality inductors, while capacitors typically have component Q values of several thousand to several tens of thousands.

Reactance of an inductor may be calculated according to equation 3 below, where f is the operating frequency in Hertz (Hz), L is the inductance of the inductor in Henrys (H), and the Greek letter omega ($\omega$) is the angular frequency (e.g., $2\pi f$) in radians per second.

$$X_L = 2\pi f L = \omega L \text{ Reactance of an inductor} \qquad \text{EQ. 3}$$

By rearranging equation 1, the AC resistance ($r_{ac}$) of a coil in an electric vehicle charging pad may be calculated utilizing the measured or calculated coil inductance $X_L$ according to equation 4.

$$r_{ac} = X_L/Q_L \text{ AC Resistance of an inductor} \qquad \text{EQ. 4}$$

Accordingly, in an example where a 1 meter diameter coil having 7 turns, an inductance of 58 µH, a Q of 500 when no vehicle is present, and a Q of 300 when a vehicle is present but not charging is driven at a frequency of 80 kHz, the AC resistance of the inductor while no vehicle is present would be $r_{ac} = 2\pi*80,000*0.000058/500 = 58$ mΩ.

The energy storage capability of a resonator (e.g., the resonator 200) is also known as Q. This Q is the inherent or unloaded Q of the resonator alone. By contrast, the resonator also has a loaded Q, which is the energy storage capability of the resonator when it is loaded.

To be useful, some energy must be extracted from the resonator. In the case of a clock driven by the pendulum, energy is extracted from the pendulum to drive the gears to turn the hands on the face of the clock. In the case of wireless power transfer, power is extracted to charge a battery or operate the device or vehicle. If energy must be extracted from the resonator, energy must first be injected into the resonator. For the pendulum-driven clock, a separate falling weight system is used to inject energy into the pendulum by giving the pendulum a "push" to keep it swinging. In this way, potential energy stored in the falling weight system is transferred to kinetic energy in the pendulum. For a wireless power system, a source (e.g., grid powered or via other power source such as a battery) couples energy into the resonator. Both the injection and the extraction of energy into and out of the resonator, respectively, load the oscillation of the resonator as if the resonator had additional losses. This effectively lowers the Q. This is known as loaded or operating Q.

Figure 3:
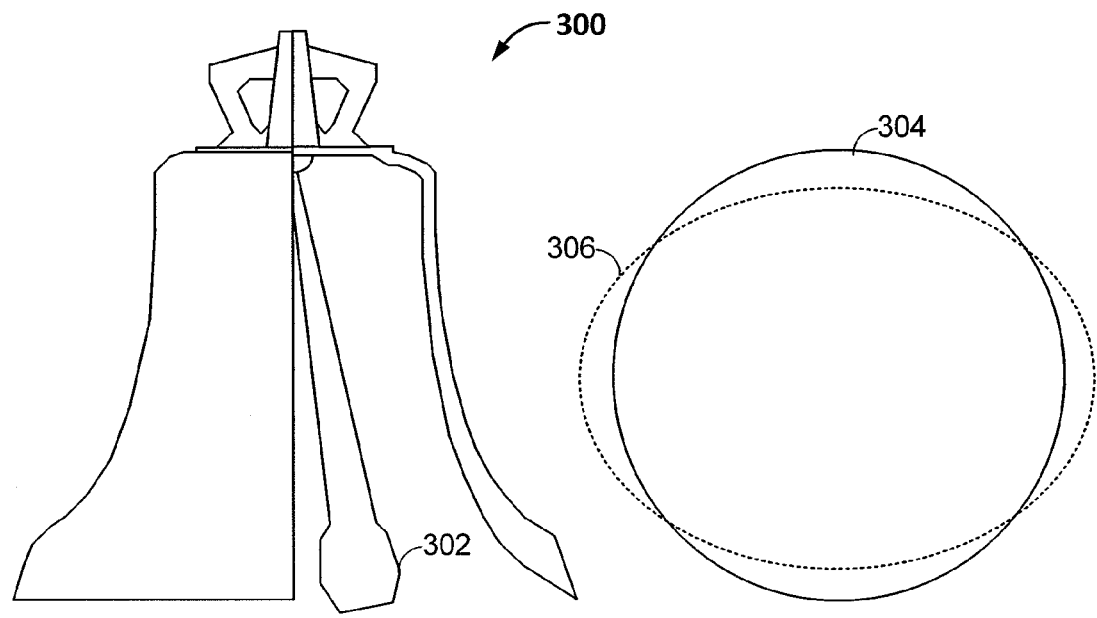
FIG. 3 illustrates a bell as a model of an exemplary physical resonator.

To help envision the concept of unloaded Q verses loaded Q an analogy to a ringing bell may be useful. FIG. 3 illustrates a bell 300 as a model of an exemplary physical resonator. The bell 300 is a physical resonator that stores energy in mechanical vibrations. The vibrations cause the mouth of the bell 300 to flex. An initial striking of the bell 300 with the clapper 302 imparts energy into the bell 300 causing the bell 300 to bend, oscillating between its resting round shape 304 and an elliptical shape 306. This is a form of stored potential energy, similar to that stored in an oscillating spring. This potential energy is released over time in the form of sound waves as the shape of the mouth of the bell oscillates back and forth. The sharp strike of the clapper 302 imparts the energy into the bell 300 without further loading, allowing the high Q mechanical resonator to oscillate unimpeded by the driving force. This is analogous to a very loose coupling between the energy source and a primary resonator of a wireless power transfer system, which allows the primary resonator to oscillate substantially unloaded by the driving force. The air surrounding the bell 300 loads the bell 300 by resisting the motion of vibration. The air is analogous to a load being coupled to the secondary resonator to extract energy. The time the bell 300 rings after being struck is a measure of its loaded Q, as most of the energy is released in the form of sound waves. By contrast, if the bell 300 was placed in a vacuum and the time taken for the bell 300 to stop ringing was measured, this measurement would reveal the unloaded Q of the bell 300 because the only energy loss would be inherent to the resonator, resulting from flexure-induced heating of the bell 300.

Calculating the loaded Q of a resonator follows the same logic as the unloaded Q. Again, it is the ratio of energy stored to the energy dissipated. Since the load on the resonator is a dissipative factor, it may be represented as the resistance 210 ($r_L$) in series with the other components of the resonator 200 as shown in FIG. 2. Thus, by adding the component loss resistance ($r_{ac}$) to the loading resistance ($r_L$) (neglecting the extremely small radiation losses $r_{radiation}$) the loaded Q ($Q_{LOADED}$) may be determined according to the ratio of the reactance to the resistances as shown in equation 5 below.

$$Q_{LOADED} = X_L/(r_{ac}+r_L) \text{ loaded } Q \text{ of the resonator} \qquad \text{EQ. 5}$$

In practice $r_L \gg r_{ac}$ because the losses in the resonator itself are minimized by design and because the loading is necessarily large to transfer useful power into or out of the circuit. Thus, equation 5 may be simplified to the approximation of equation 6 below.

$$Q_{LOADED} = X_L/r_L \text{ approximate loaded } Q \text{ of the resonator} \qquad \text{EQ. 6}$$

Figure 4:
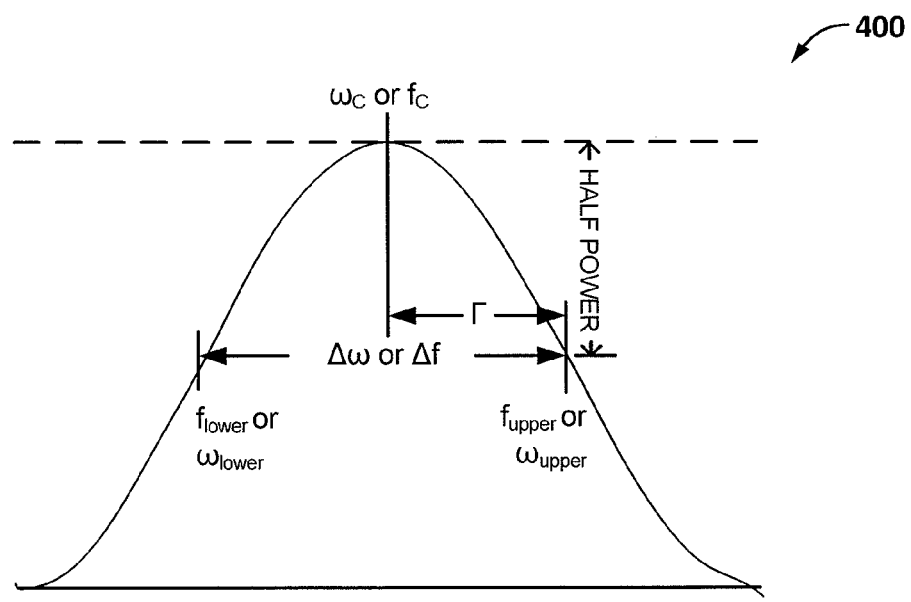
FIG. 4 illustrates a frequency response curve for an exemplary resonator.

The above discussion on Q thus far has been based on the time it takes to dissipate energy in a resonator. However, resonators also have a property of bandwidth, or the range of frequencies over which the resonator can oscillate. Bandwidth is closely related to the rate of energy dissipation. Resonators that dissipate energy quickly have wide bandwidths, while resonators that sustain longer oscillations have narrow bandwidths. For convenience, bandwidth is generally defined as the frequency range over which oscillations occur at more than half of the peak response value. For ease of visualization, FIG. 4 illustrates a frequency response curve 400 for an exemplary resonator. The peak response is designated as the "center frequency", e.g., $\omega_C$ or $f_C$. For example, to determine the bandwidth of a resonator find the peak resonance value. Under most critically coupled or sub-critically coupled circumstances, a single peak response occurs at the center frequency. Now reduce the frequency until the response is half of the peak value. This value is the lower cutoff frequency ($f_{lower}$ or $\omega_{lower}$). Then, starting at the center frequency again, increase the frequency until the response is again half of the peak. This value is the upper cutoff frequency ($f_{upper}$ or $\omega_{upper}$). The difference between the upper cutoff frequency and the lower cutoff frequency is the bandwidth, as shown by equations 7 and 8 below, where the letter delta ($\Delta$) stands for the difference between two values.

$$\text{Bandwidth} = f_{upper} - f_{lower} = \Delta f \qquad \text{EQ. 7}$$

$$\text{Bandwidth} = \omega_{upper} - \omega_{lower} = \Delta \omega \qquad \text{EQ. 8}$$

The units of frequency can be removed from the equation by expressing bandwidth as a fraction of the center frequency $f_c$ or $\omega_c$. As it turns out, the bandwidth of a resonator is inversely proportional to its Q, which gives rise to the alternative expressions for Q shown in equations 9 and 10 below, where $\omega_c$ is the center angular frequency and $f_c$ is the center frequency.

$$\Delta\omega = \omega_c/Q \text{ or } \Delta f = f_c/Q \qquad \text{EQ. 9}$$

$$Q = \omega_c/\Delta\omega \text{ or } Q = f_c/\Delta f \qquad \text{EQ. 10}$$

Following are example bandwidth calculations for two exemplary resonators. In the first example, supposing a resonator with a center frequency $f_c$=100 Hz and a Q=25, $\Delta f = f_c/Q = 100$ Hz/25=4 Hz. The $f_{upper}$=102 Hz and the $f_{lower}$=98 Hz. In the second example, supposing a resonator with a center frequency, again, of $f_c$=100 Hz but with a Q=5, $\Delta f = f_c/Q = 100$ Hz/5=20 Hz. The $f_{upper}$=110 Hz and the $f_{lower}$=90 Hz. As can be seen, the lower Q (e.g., 5) broadens the response versus the higher Q (e.g., 25). However, all other factors being equal, a lower Q circuit will have a lower peak response (e.g., magnitude of response at the center frequency) than a higher Q circuit. This should make sense, since Q is essentially the ratio of stored energy to dissipated energy. Higher Q means more stored energy, which translates to a higher peak response at resonance.

In addition, the Greek letter gamma ($\Gamma$) is generally used for the resonance width (e.g., half the bandwidth), or deviation of the cutoff frequencies (e.g., $f_{upper}$ and $f_{lower}$) from the center frequency ($f_c$). Thus the resonance width $\Gamma$ may be expressed according to equation 11 below.

$$\Gamma = \Delta f/2 = \Delta\omega/2 \qquad \text{EQ. 11}$$

Combining equation 11 with equation 9 above, substituting for $\Delta\omega$ and $\Delta f$, the resonance width $\Gamma$ may be expressed in terms of Q according to equation 12, and rearranging, Q pay be expressed in terms of the resonance width $\Gamma$ according to equation 13 below.

$$\Gamma = \omega_c/2Q = f_c/2Q \qquad \text{EQ. 12}$$

$$Q = \omega_c/2\Gamma = f_c/2\Gamma \qquad \text{EQ. 13}$$

As above, $\Gamma$ may be expressed as fractional bandwidth where the frequency disappears from the equation, as shown by equation 14 below.

$$Q = 1/2\Gamma \qquad \text{EQ. 14}$$

To wirelessly transfer power over a distance two resonators are needed; one to act as the primary resonator to convert the electrical power source into a magnetic field, and another to act as the secondary resonator to absorb power from the magnetic field and convert it to electrical power. This discussion is in terms of transformer action with a primary resonator being the source and the secondary resonator being the sink of power transfer. It is important to make this distinction because the engineering formulas for transformer action describe the operation of wireless power transfer accurately. By contrast, the formulas for radio wave propagation are not only inaccurate in the context of wireless power transfer, but they are undefined for the configurations at hand. A short description follows with respect to FIG. 5.

Figure 5:
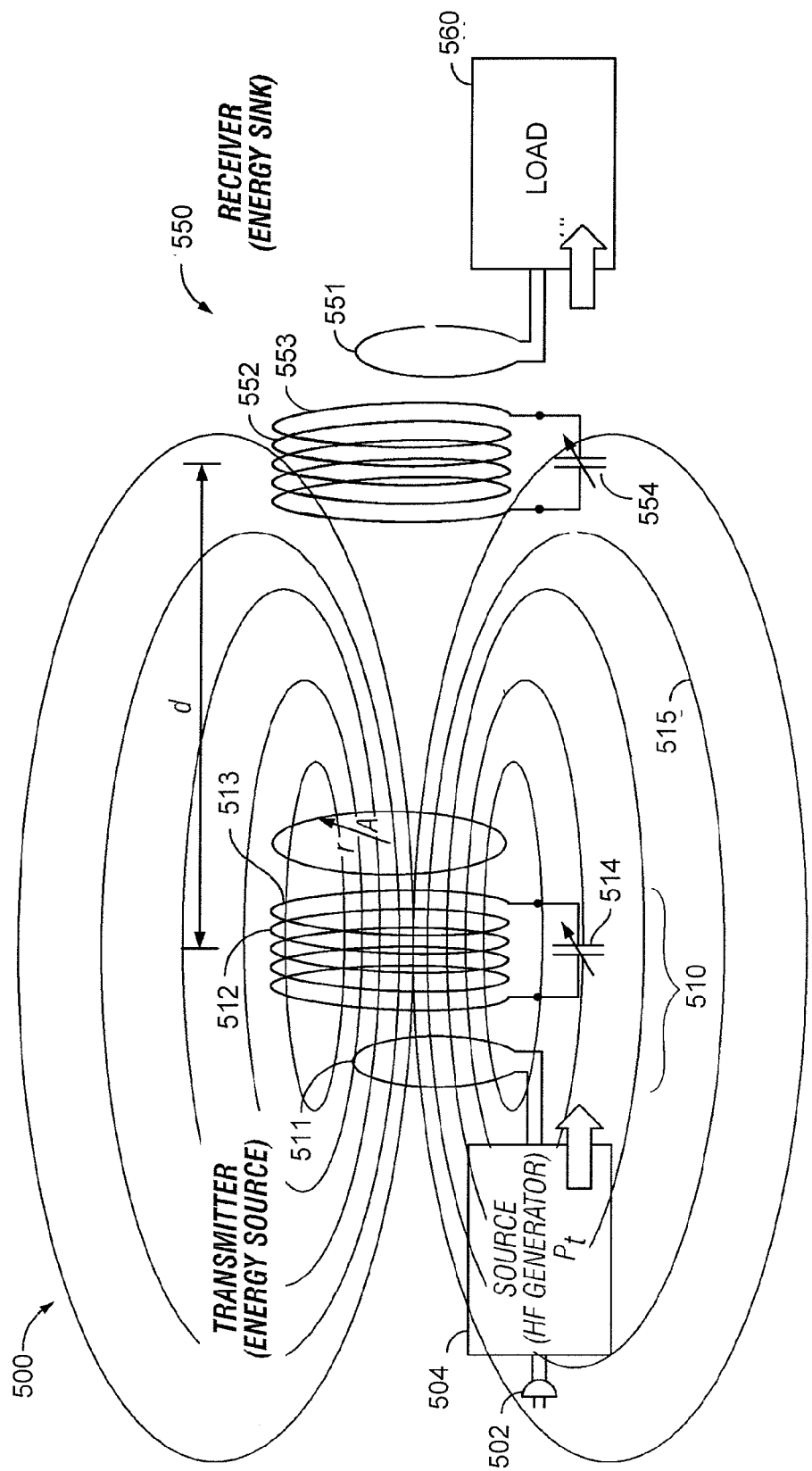
FIG. 5 is a functional block diagram of a wireless power transfer system, in accordance with an exemplary implementation.

FIG. 5 is a functional block diagram of a wireless power transfer system 500, in accordance with an exemplary implementation. The system 500 receives power from a source 502, for example, an AC plug. A frequency generator 504 is used to couple the energy to transmitter 510. The transmitter 510 includes a coupling circuit 511 (e.g., an inductive or coupling loop as one example, which is inductively coupled to, but is electrically or galvanically isolated from, a primary resonator 512). The primary resonator 512 includes a number N of coil loops (e.g., an inductor) 513; each loop having a radius $r_A$. A capacitor 514, here shown as a variable capacitor, may be located in series with the coil loops 513, forming a resonant loop, as previously described in connection with FIG. 2. In the implementation, the capacitor is a totally separate structure from the coil loops 513. However, in certain implementations, the self-capacitance of the wire forming the coil loops 513 may form the capacitor 514. The frequency generator 504 may be tuned to output a signal at the resonance frequency of the primary resonator 512. As previously described, the primary resonator 512 is non-radiative, in the sense that much of the output of the primary resonator 512 is not radiating electromagnetic energy, but rather a magnetic field 515 in the near field of the primary resonator 512.

A receiver 550 includes a secondary resonator 552 placed a distance "d" away from the primary resonator 512. The secondary resonator 552 may comprise a coil of loops (e.g., an inductor 553 and a capacitor 554, coupled to a second inductive coupling loop 551. The output of the coupling circuit 551 may be further rectified in a rectifier and/or provided to a load 560. The coupling circuit 551 shown is an example of one type of coupling circuit 551 configured as a coupling loop that is inductively coupled to, but electrically or galvanically isolated from the secondary resonator 522. The energy can be transferred through either electrical field coupling or magnetic field coupling, although magnetic field coupling is predominantly described herein as an implementation. Magnetic field coupling may be preferred, since extraneous objects in the magnetic field 515 have the same magnetic properties as "empty" space.

When the two resonators 512 and 552 are brought close together the magnetic flux 515 from the inductor 513 in the primary resonator 512 cuts through the inductor 553 in the secondary resonator 552. The current flowing in the first inductor 513 (e.g., the primary resonator) induces a voltage in the second inductor 553 (e.g., the secondary resonator) causing current to flow in the second inductor 553. This circuit may follow transformer action between the two inductors. The two inductors 513/553 are coupled to a degree indicated by a coupling coefficient k, having values between 0 and 1. The coupling coefficient is a measure of the amount of flux from the primary resonator 512 that cuts through the secondary resonator 552. Where none of the flux from the primary resonator 512 cuts through the secondary resonator 552, k=0. Where all of the flux from the primary resonator 512 cuts through the secondary resonator 552, k=1. The value of the coupling coefficient k depends on, among other things, the physical size of and number of turns in the inductors 513/553, the distance "d" between the inductors 513/553, and the use of ferrite and/or other ferromagnetic materials in the construction of the inductors 513/553.

The two inductors 513/553 have a mutual inductance M, expressed in Henrys (H), which is a measure of the coupling between the two inductors 513/553, and may be determined according to equation 15 below, where L1 and L2 are the inductances of the first 513 (e.g., primary) and second 553 (e.g., secondary) inductors, respectively.

$$M = k\sqrt{(L1 L2)} \qquad \text{EQ. 15}$$

The part of the inductance that is not mutual represents the flux generated by the first inductor 513 that does not cut through the second inductor 553 and is called the leakage inductance. The leakage inductance in a high quality power transformer may amount to only a few percent of the total inductance. In such cases, the coupling coefficient k will be very nearly 1. In the case of wireless power transfer the leakage inductance may exceed the mutual inductance. In such cases, the coupling coefficient k may be less than 0.5. Very loosely coupled primary and secondary resonators (e.g., where there is a large distance between the primary and secondary resonators) may have a coupling coefficient less than 0.1. Since the coupling coefficient k indicates how much one resonator affects the other, it can be used to determine the loading factor on a resonator, which, in turn, determines the loaded Q of the resonator. The logic follows the calculation of the loading factor above. For k<0.5 instead of the load ($r_L$), k may be used to represent the dissipative factor in the resonator, according to equation 16 below.

$$Q_{LOADED} = X_L/r_L \approx X_L/k \text{ loaded } Q \text{ of transformer coupled resonator} \qquad \text{EQ: 16}$$

Of course, real-world engineering analysis is more complex, including calculation of energy coupled into the primary resonator, calculation of energy coupled from the primary resonator to the second resonator, and calculation of energy coupled from the secondary resonator to the load, though the above principles still apply in general.

Figure 6:
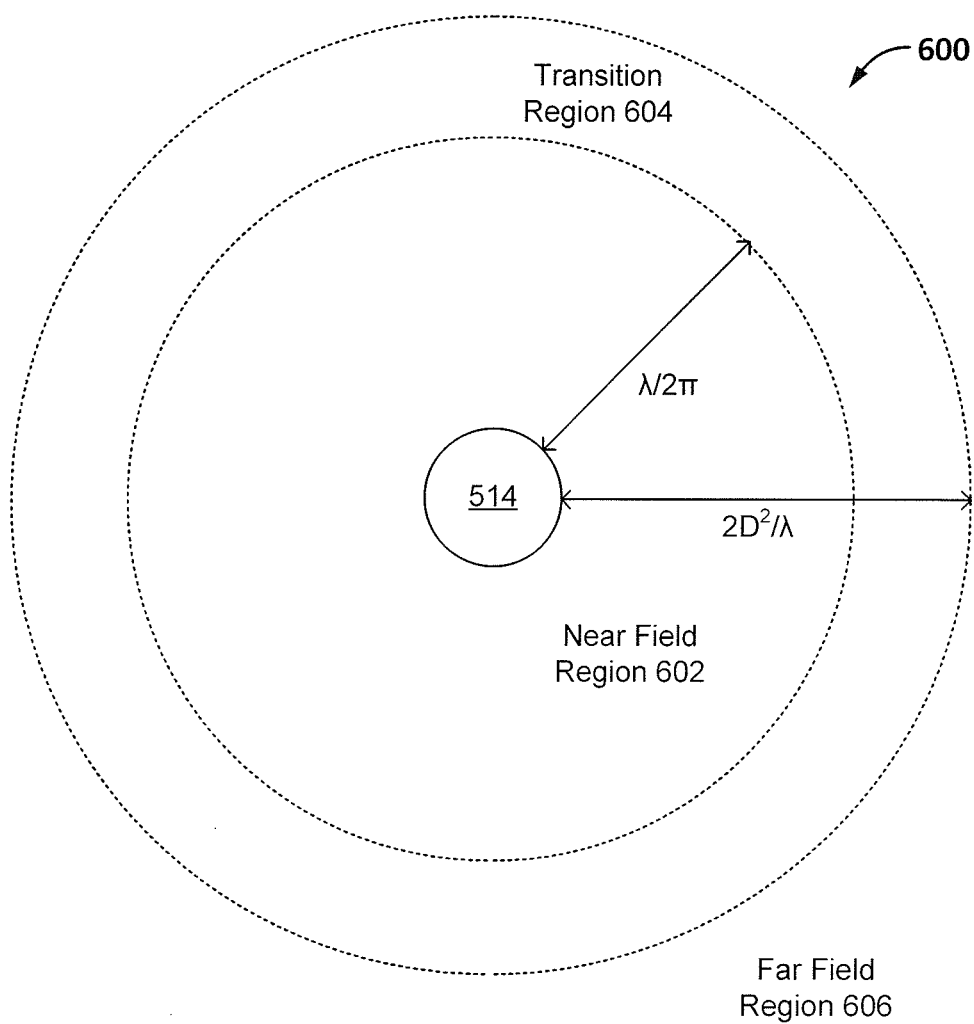
FIG. 6 shows a diagram of near field, transition, and far field regions for wireless resonant inductive charging, in accordance with an exemplary implementation.

At the distances and frequencies of practical wireless power transfer the magnetic field dominates. The terms near field and far field are used to describe the regions where fields are converted to waves. There are several definitions defining the boundary between near field and far field. However, the following is the most conservative. FIG. 6 shows a diagram 600 of near field, transition, and far field regions for wireless resonant inductive charging, in accordance with an exemplary implementation. The reactive near field 602 exists in the volume where the magnetic field dominates, e.g., within a distance of $\lambda/2\pi$, where $\lambda$ is the wavelength of the magnetic field. As the electric current in the coil 513 of FIG. 5 flows on the positive half of the cycle, the magnetic field builds in one direction. When the electric current reverses on the negative half cycle, the magnetic field collapses and drives the energy back into the coil 513. The magnetic field then builds in the opposite direction. For every cycle the energy is exchanged between the electric current and the magnetic field. Accordingly, the reactive near field for a wireless power transfer system operating at 100 kHz would include the volume within 477 meters of the charging pad. For charging pad operating at 6 MHz, the volume within 8 meters would be the reactive near field.

When the wireless power transfer primary coil is much smaller than a wavelength, nearly all of the energy remains contained in the oscillating magnetic field surrounding the primary coil. In the "near field" zone 602 there is no electromagnetic wave because there is literally no room for it. In a transition zone 604, defined by the distance from the primary coil 513 of between $\lambda/2\pi$ and $2D^2/\lambda$, where D is the largest dimension of the resonator and $\lambda$ is the wavelength, some of the magnetic field energy couples to an electric field and creates an EM wave. As the magnetic field builds and collapses, driven by the electric current in the primary coil 513, some of the energy in the magnetic field does not get converted back to electric current. As the magnetic field is collapsing, the flux lines are moving, which generates an electric field in the space surrounding the coil 514. These moving electric fields in turn generate a magnetic field, causing the energy to couple back and forth in an electromagnetic wave that travels away from the source. In the radiating far field 606, at a distance from the primary coil 513 of greater than $2D^2/k$, the pure magnetic field has decayed and no longer dominates the electric field. At this distance outward, the EM wave is well established and contains most of the energy that is not returned to the coil.

Figure 7:
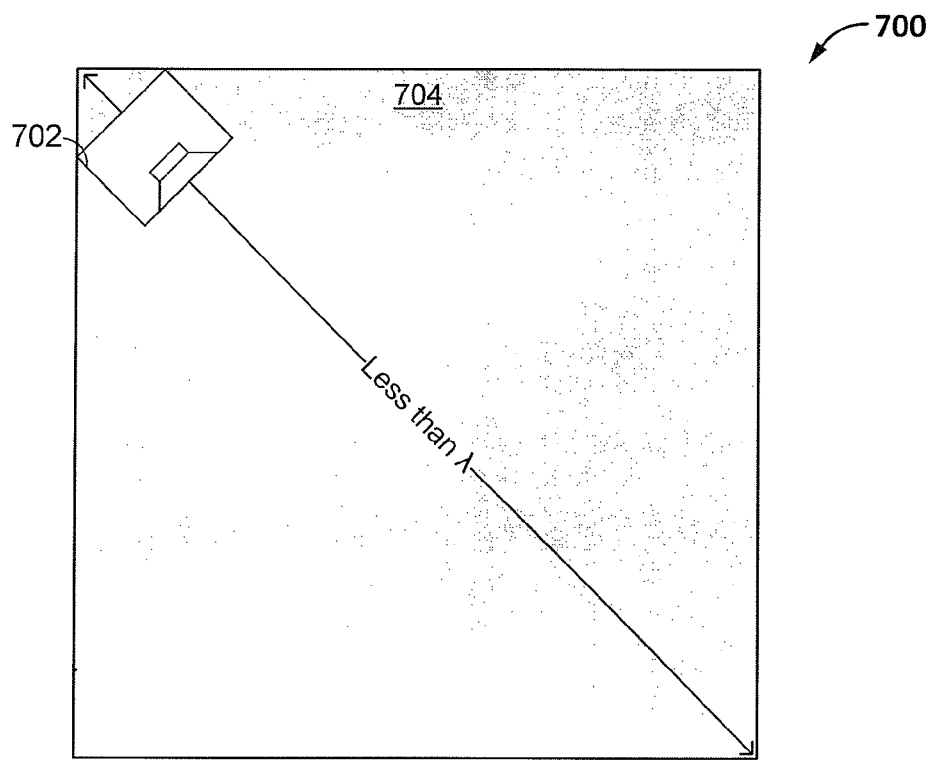
FIG. 7 is a diagram of a speaker in a room having dimensions smaller than a wavelength of sound emitted from the speaker.

To better understand the differences between the near and far fields, an acoustic analogy may be helpful, wherein a source of energy is in a confined volume analogous to the reactive near field versus an unconfined volume analogous to the far field. FIG. 7 is a diagram 700 of a speaker 702 in a room 704 having dimensions smaller than a wavelength of sound emitted from the speaker 702. As shown in FIG. 7, the dimensions of the room 704 are smaller than the wave length $\lambda$ of a sound emitted by the speaker 702. The room 704 is sealed so that no air can escape or enter. A speaker 702 is located inside the room 704. The speaker box is sealed so that no air can enter or escape. In such a situation, the speaker cone acts as piston. When the cone moves out, the air pressure in the entire room 704 increases while the air pressure in the speaker box decreases. When the cone moves in, the air pressure in the entire room 704 decreases while the air pressure in the speaker box increases. This is because the pressure change propagates to the boundaries of the room 704 before the cone begins to move back. Because the wave length of the sound signal is longer than the room 704, the air pressure in the entire room 704 changes at substantially the same time. Thus, no wave is produced because the room is not large enough to contain both the low pressure and high pressure portions of the sound wave at the same time.

Figure 8:
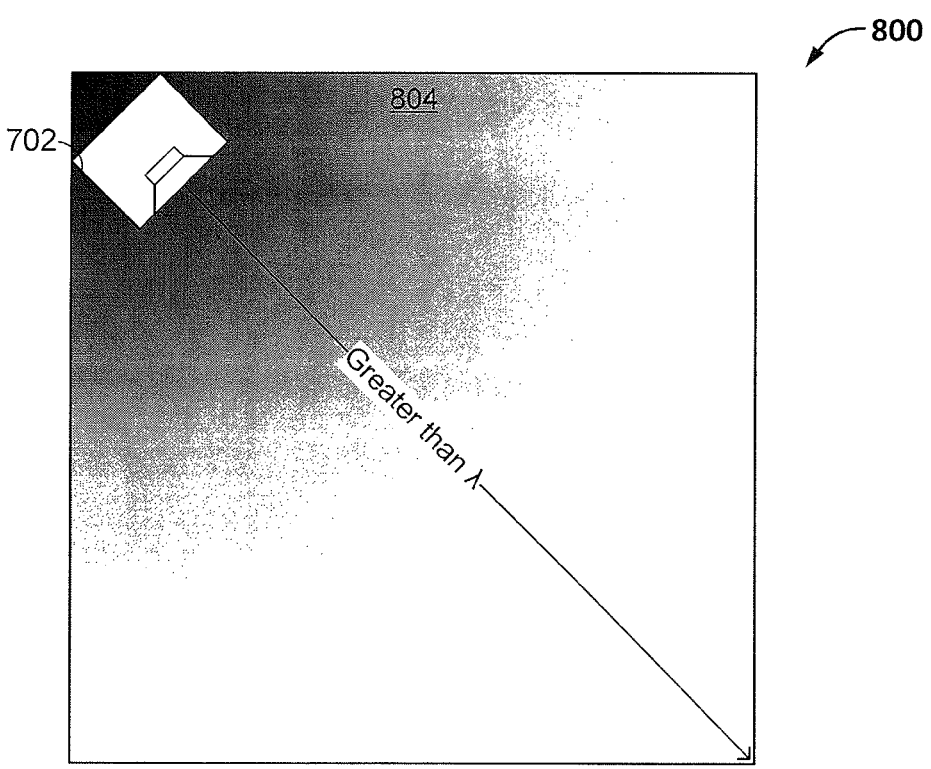
FIG. 8 is a diagram of the speaker in a room having dimensions larger than the wavelength of sound emitted from the speaker.

FIG. 8 is a diagram 800 of the speaker 702 in a room 804 having dimensions larger than the wavelength of sound emitted from the speaker 702. As shown in FIG. 8, the dimensions of the room 802 are much larger than the wave length $\lambda$ of a sound signal. The room 804 and the speaker box are sealed as described above in connection with FIG. 7. Now when the speaker cone moves out the air pressure immediately in front of the cone is increased. Because the room 804 is much larger than a single wavelength $\lambda$, the cone changes direction and begins to move back inward before the increased pressure can propagate to the rest of the room. This manifests as a reduced pressure immediately in front of the cone. Because it takes longer than one cycle of the speaker cone movement for air pressure changes to propagate to the edges of the room 804, the air pressure farther away from the speaker cone cannot keep up with changes the cone makes, causing pressure waves to propagate away from the speaker cone. At any point in the room 804 the pressure builds to a peak of pressure, decays to neutral, builds to a negative peak, and then decays back to neutral. If one were to track the pressure peak, it would appear as a wave moving away from the speaker at the speed of sound (e.g., approximately 1 foot per second).

Thus, to an observer very close to the front of the speaker cone, the air pressure would appear to follow the movement of the cone. This is analogous to the reactive near field. Contrarily, farther away from the speaker cone the pressure changes appear to move in waves that propagate at the speed of sound. This is analogous to the far field, though in the case of electromagnetic waves, the waves propagate at the speed of light, approximately one million times faster than sound.

The near field and far fields are defined relative to the frequency (e.g., the wavelength) of the disturbing force (e.g., the speaker cone in the acoustic examples of FIGS. 7 and 8 and the magnetic field 515 generated by the primary resonator 512 of FIG. 5). The sound from a subwoofer in a living room, for example, may be completely in the near field while the sound from a tweeter may be in the far field within a few centimeters distance from the tweeter.

The unloaded Q of an L-C resonator is usually dominated by the resistive loss in the inductor winding. The term intrinsic Q includes both the resistive losses in the inductor winding as well as the radiation loss. The radiation loss is the unintended leakage of an electromagnetic (EM) wave, which is also called antenna effect. Radiation loss can be represented as another resistor 208 ($R_{radiation}$) in series with $r_{ac}$, as previously shown in FIG. 2. However, $R_{radiation}$ should not be confused with the energy transferred via magnetic field coupling, since radiation describes wave phenomena and the coupling used for power transfer is simply an alternating magnetic field. The radiation loss $R_{radiation}$ may be calculated according to equation 17 below, where N is the number of turns in the coil, S is the surface area of the coil (e.g., for a substantially circular coil, equal to $\pi*radius^2$), and $\lambda$ is the wavelength of emitted waves (e.g., the speed of light divided by frequency).

$$R_{radiation} = (177*N*S/\lambda^2)^2 \quad \text{EQ. 17}$$

For example, utilizing the same primary resonator coil as in the previous example, having 7 circular turns, a diameter of 1 meter and being driven at a frequency of 80 kHz, $S=\pi(diameter/2)^2=\pi(1\ m/2)^2=0.785\ m^2$, $\lambda=300,000,000/f=300,000,000/80,000=3,750$ m, and $R_{radiation}=((177*7*0.785)/3,750^2)^2=4.79$ nΩ ($10^{-9}$Ω).

The above example shows that antenna efficiency is approximately 0.000000016% for the exemplary inductive power primary coil. For this reason, inductive power coils make very poor antennas. Since the coil must comply with emissions standards, the frequency of operation and magnetics configuration are selected and designed to suppress this small amount of radiation even further.

Figure 9:
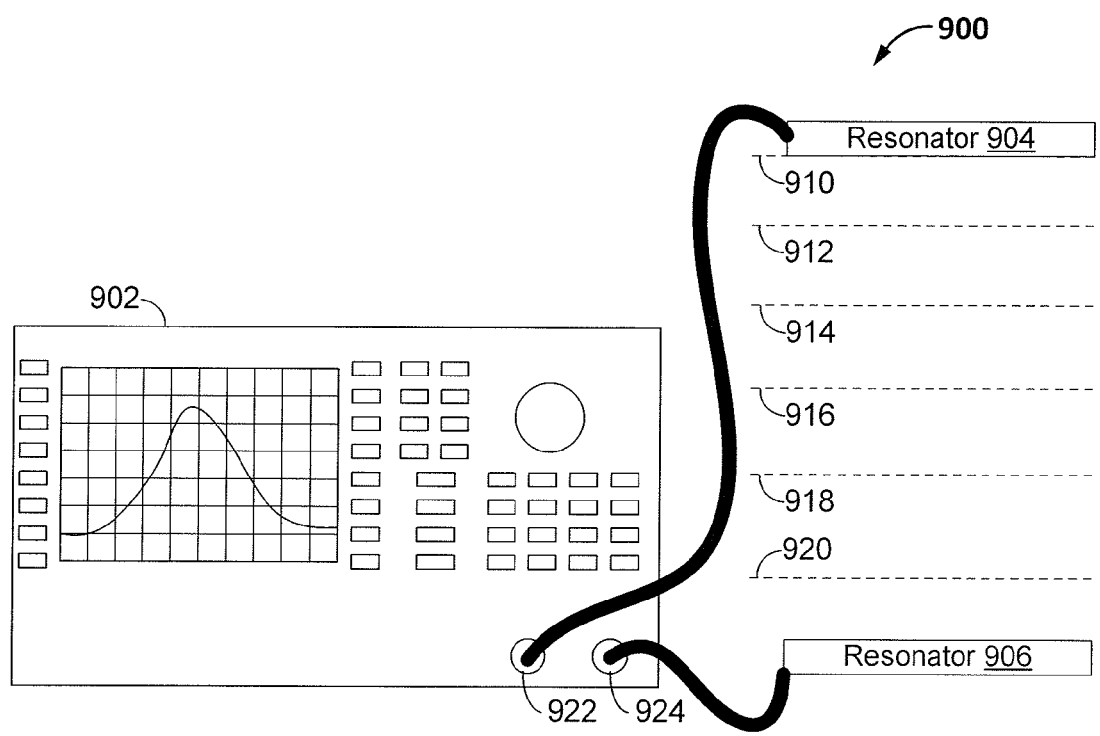
FIG. 9 illustrates a plurality of positions of a primary resonator and a secondary resonator while wireless power throughput is measured, in accordance with an exemplary implementation.

With respect to performance of high Q verses low Q configurations for a transmitter wirelessly transferring power to a receiver, the following demonstration may be illustrative. FIG. 9 illustrates a plurality of positions of a primary resonator and a secondary resonator while wireless power throughput is measured, in accordance with an exemplary implementation. FIG. 9 includes a spectrum analyzer 902 having a built-in tracking generator. The tracking generator may generate a constant amplitude signal that is swept across a frequency band. The spectrum analyzer 902 measures the signal by sweeping a receiver (e.g., the resonator 906) across the band. The spectrum analyzer 902 may display amplitude vs. frequency with the operating frequency set to the center of the analyzer display. The start and stop frequencies and the sweeping may be synchronized between the tracking generator and the spectrum analyzer 902. A network analyzer is a similar instrument, with a signal source and an analyzer to measure electrical networks as a function of frequency. The spectrum analyzer 902 may also comprise a network analyzer. The demonstration is configured as follows. The output 922 of the tracking generator is coupled to a first resonator 904 comprising a printed circuit coil connected to a high quality capacitor (not shown). A second resonator 906, identical to the first resonator, is coupled to the spectrum analyzer input 924. The first 904 and second 906 resonators are each tuned to the same center frequency and have a measured inherent or unloaded Q of 198. For this experiment, the first 904 and second 906 resonators comprise coils each having 4 turns of wire 6 inches in diameter.

Figure 10:
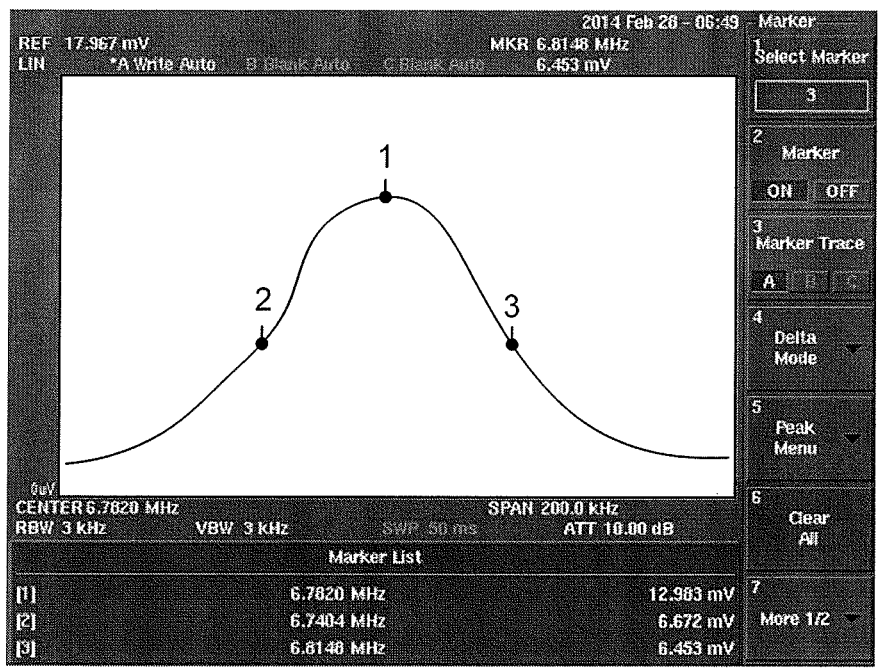
FIG. 10 illustrates the power throughput versus frequency for a high loaded Q primary to secondary resonator power transfer setup, in accordance with an exemplary implementation.
Figure 11:
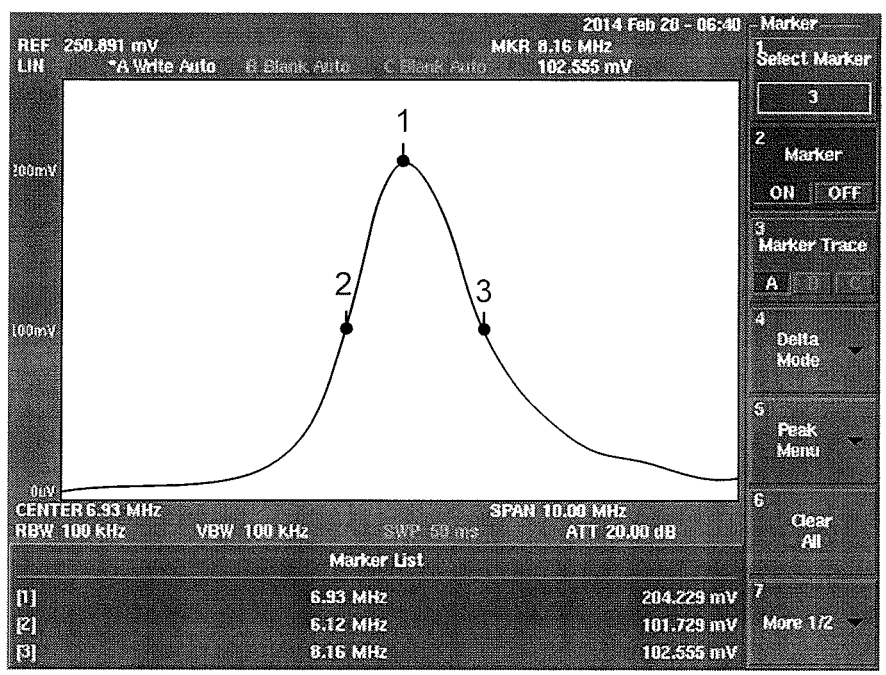
FIG. 11 illustrates the power throughput versus frequency for a low loaded Q primary to secondary resonator power transfer setup, in accordance with an exemplary implementation.

Two configurations were tested only differing by coupling. For example, the coupling from the source (e.g., the tracking generator) into the primary resonator was set to be very loose for a high Q test, and very tight for a low Q test. FIGS. 10 and 11 show the power throughput versus frequency for the high Q and low Q test for determining loaded Q, respectively.

FIG. 10 illustrates the power throughput versus frequency for a high loaded Q primary to secondary resonator power transfer setup, in accordance with an exemplary implementation. As shown, the center frequency ($f_c$), as signified by the numeral "1," is at 6.78 MHz, the lower cutoff frequency ($f_{lower}$), as signified by the numeral "2," is at 6.74 MHz, and the upper cutoff frequency ($f_{upper}$), as signified by the numeral "3," is at 6.81 MHz. These results are summarized below in Table 1.

FIG. 11 illustrates the power throughput versus frequency for a low loaded Q primary to secondary resonator power transfer setup, in accordance with an exemplary implementation. As shown, the center frequency ($f_c$), as signified by the numeral "1," is at 6.12 MHz, the lower cutoff frequency ($f_{lower}$), as signified by the numeral "2," is at 6.93 MHz, and the upper cutoff frequency ($f_{upper}$), as signified by the numeral "3," is at 8.16 MHz. These results are summarized also below in Table 1.

The measured responses of the loose (e.g., high Q) and tight (e.g., low Q) couplings are summarized in table 1 below. The loose coupling results in a high loaded Q while the tight coupling results in a much lower loaded Q value.

TABLE 1

|  | Loose Coupling | Tight Coupling |
| --- | --- | --- |
| Peak frequency ($\omega_c$) (Hz) | 6.78 MHz | 6.93 MHz |
| Cutoff$_{LOWER}$ (Hz) | 6.74 MHz | 6.12 MHz |
| Cutoff$_{UPPER}$ (Hz) | 6.81 MHz | 8.16 MHz |
| EQ. 10: Calculated $Q_{LOADED}$ | 97 | 3.4 |

The demonstration of power throughput was carried out in three stages. In each of the three stages the resonators 904/906 begin positioned far apart and are moved closer to one another for each of a plurality of successive measurements, the positions being represented by at least a subset of the dashed lines 910, 912, 914, 916, 918 and 920 as shown in FIG. 9. A response closer to the top of the screen represents a higher throughput. A response nearer the bottom of the screen represents a lower throughput. A first stage illustrates a test of the high Q configuration where the frequency is held constant at the peak resonant frequency ($\omega_c$ or $f_c$). A second stage illustrates a test of the high Q configuration where the frequency is swept across a particular bandwidth. A third stage illustrates a test of the low Q configuration where the frequency is swept across the particular bandwidth.

Figure 12A:
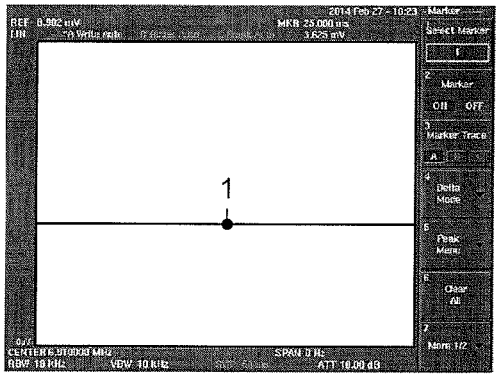
FIGS. 12A-12F illustrate power throughput at a center frequency for several different separations between the primary resonator and the secondary resonator of FIG. 9 when loosely coupled, in accordance with an exemplary implementation.
Figure 12B:
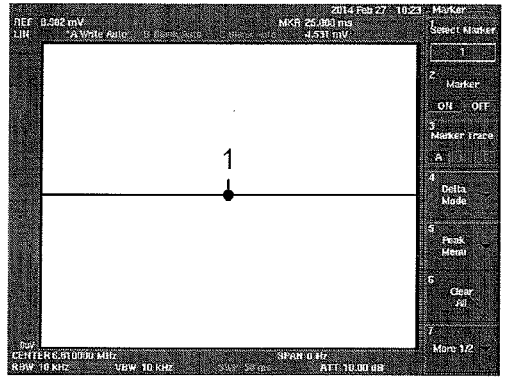
Figure 12C:
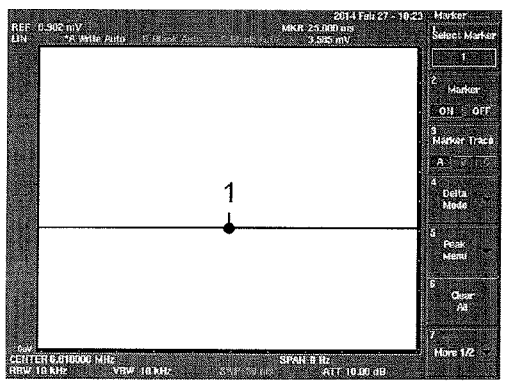
Figure 12D:
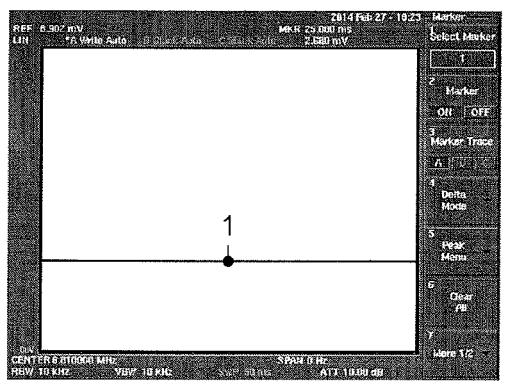
Figure 12E:
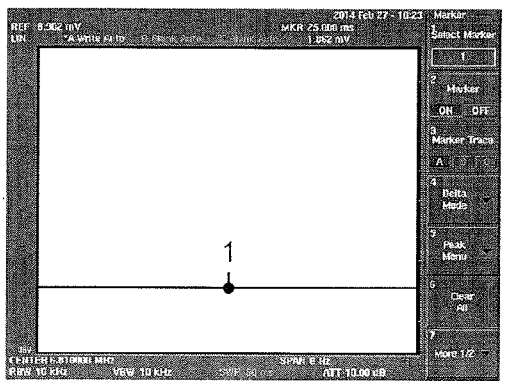
Figure 12F:
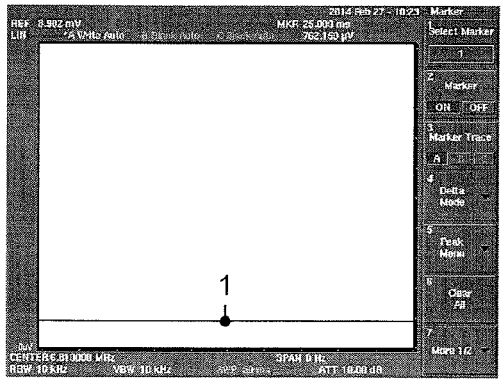

FIGS. 12A-12F illustrate power throughput at a center frequency for several different separations between the primary resonator and the secondary resonator of FIG. 9 when loosely coupled, in accordance with an exemplary implementation. As shown by FIG. 12A, in the first stage, when the first and second resonators are held approximately 30 centimeters apart, corresponding to the position 910 in FIG. 9, the response is near the middle of the screen showing good throughput. At FIG. 12B, wherein the first and second resonators are adjusted to be approximately 25 cm apart, corresponding to position 912 of FIG. 9, the response goes up, indicating better throughput as compared to the 30 cm separation of FIG. 12A. At FIG. 12C, the first and second resonators are approximately 20 cm apart, corresponding to position 914 of FIG. 9, and the response drops as compared to either the 30 cm or 25 cm separations of FIGS. 12A and 12B, respectively. At FIG. 12D, the first and second resonators are adjusted to a separation of approximately 10 cm, corresponding to the position 916 of FIG. 9, and the response drops yet again. Similarly, in FIGS. 12E and 12F, the first and second resonators are adjusted to separations of approximately 5 cm and 0 cm, respectively, corresponding to the positions 918 and 920 of FIG. 9. As shown, the response continues to drop as the first and second resonators are adjusted closer together.

Holding the first and second resonators at closer separations should give better coupling. FIGS. 13A-13F describe why the response at the peak resonant frequency ($\omega_c$ and $f_c$) deteriorates as the resonators are moved closer to one another. In each of FIGS. 13A-13F, the frequency is swept across the bandwidth for each of the above-mentioned separations between the first and second resonators as shown in FIG. 9.

Figure 13A:
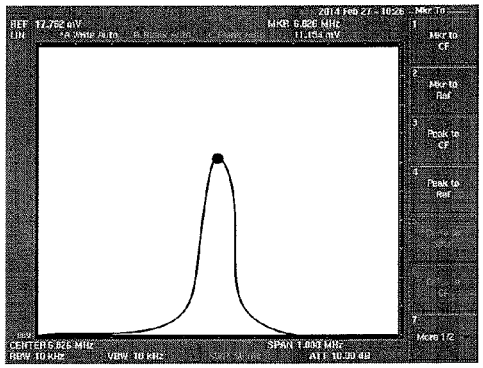
FIGS. 13A-13F illustrate power throughput across a frequency bandwidth for the separations between the primary resonator and the secondary resonator of FIG. 9 when loosely coupled, in accordance with an exemplary implementation.
Figure 13B:
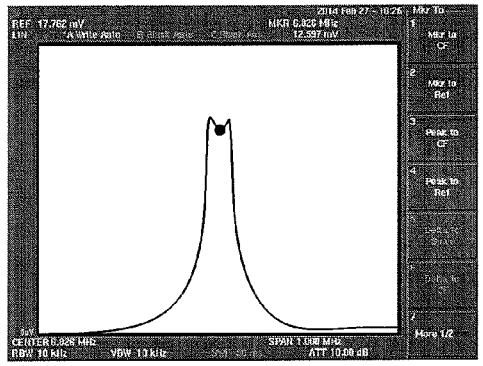
Figure 13C:
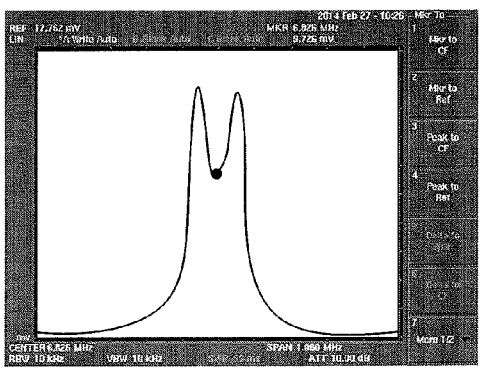
Figure 13D:
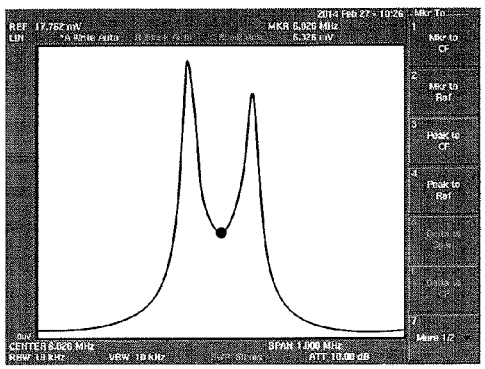
Figure 13E:
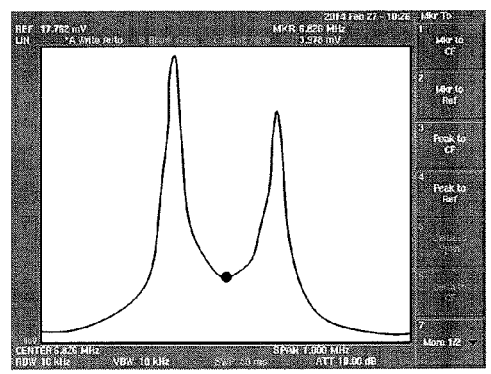
Figure 13F:
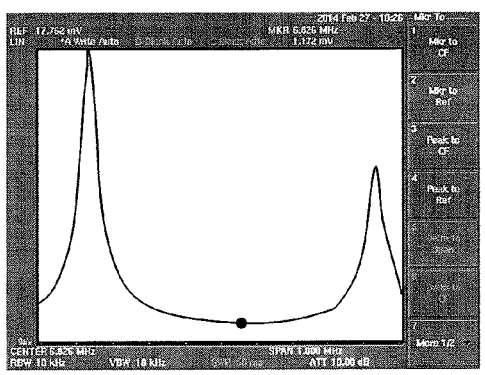

FIGS. 13A-13F illustrate power throughput across a frequency bandwidth for the separations between the primary resonator and the secondary resonator of FIG. 9 when loosely coupled, in accordance with an exemplary implementation. The separations between the first and second resonators for FIGS. 13A-13F may correspond to those for FIGS. 12A-12F, respectively, except that power throughput was measured as the frequency was swept across the frequency bandwidth corresponding to the measured $f_{upper}$ and $f_{lower}$ as described in connection with FIG. 10 above. In each of FIGS. 13A-13F, the center frequency ($f_c$) is shown by the dots in the response curves. In FIG. 13A, the response is good, showing a single peak. In FIG. 13B, as the distances between the primary and secondary resonators decreases the response increases, as expected. In FIG. 13C, the response substantially splits into two peaks on either side of the center frequency ($f_c$). This causes the throughput to increase at the side peaks but decrease at the center frequency ($f_c$). As the first and second resonators are moved closer and closer together, as shown in each of FIGS. 13D-13F, the response peaks continue to split farther and farther apart from the center frequency ($f_c$) as the throughput at the operating frequency continues drops almost to zero at FIG. 13F. This condition is often confused with a shift in the center frequency ($f_c$). However, as shown in FIGS. 13A-13F the center frequency does not shift significantly. Instead the highest power throughput splits into two peaks. The peak throughput splitting into two peaks indicates a condition of over coupling between the first and second resonators. As shown in FIGS. 13A-13F, the magnitude of the split (e.g., the frequency difference between the split peaks) is dependent upon the degree of over coupling. Moreover, operating at one of the split peaks during over coupling may require driving a highly reactive load, which may produce high circulating currents, high losses, and inefficient operation.

Figure 14A:
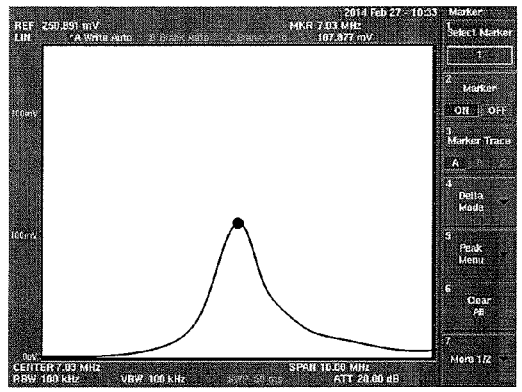
FIGS. 14A-14D illustrate power throughput across a frequency bandwidth for separations between the primary resonator and the secondary resonator of FIG. 9 when tightly coupled, in accordance with an exemplary implementation.
Figure 14B:
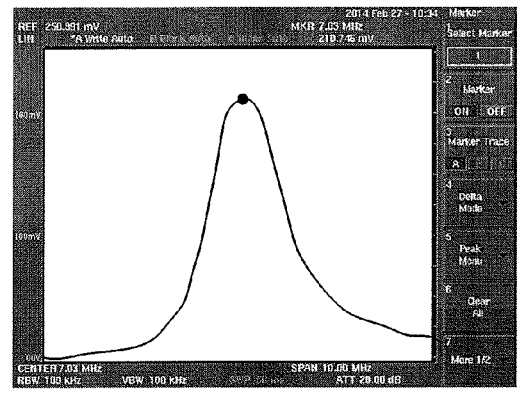
Figure 14C:
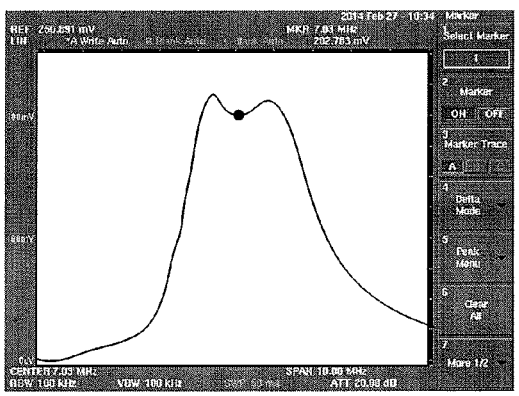
Figure 14D:
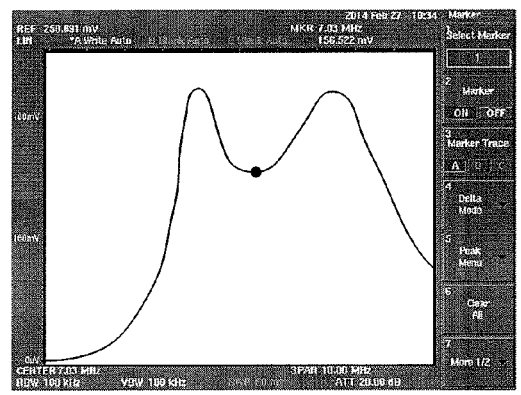

FIGS. 14A-14D illustrate power throughput across a frequency bandwidth for separations between the primary resonator and the secondary resonator of FIG. 9 when tightly coupled, in accordance with an exemplary implementation. The first through fourth screens show the low Q arrangement at separation distances of approximately 15 cm, 10 cm, 5 cm and 0 cm, respectively, and corresponding to positions 914, 916, 918 and 920, respectively of FIG. 9. FIGS. 14A-14D show power throughput measured as the frequency was swept across the frequency bandwidth corresponding to the measured $f_{upper}$ and $f_{lower}$ as described in connection with FIG. 11 above, with the center frequency ($f_c$) being indicated by the dots on the respectively response curves. As shown, the lower Q configuration does not provide as high a throughput as the high Q configuration at farther separations between the first and second resonators. In FIG. 14A, the response is near the middle of the screen. In FIG. 14B, the response is stronger than that of FIG. 14A, near the top of the screen. In FIG. 14C, the response is still relatively strong, however, the response begins to split. In FIG. 14D, the response has split further. However, the throughput at the operating frequency ($f_c$) is still relatively high. Thus, FIGS. 14C and 14D (as well as FIGS. 13C through 13F) show wireless power transfer where the first and second resonators are transferring in a condition of over-coupling.

From the above illustrations it may seem intuitive to simply retune the operating frequency to one of the peaks of the split response. However, when the operating frequency is readjusted, the peaks tend to move with the adjustment since the readjusting changes the operating conditions. Retuning the operating frequency to one of the peaks would result in a control system chasing the peak around in frequency as the circuit conditions change, for example, when the battery charges up and the load changes or when even small changes is the separation distance between the first and second resonators occurs. In addition, operating at one of the split peaks during over-coupling requires driving a highly reactive load. Reactive loads produce high circulating currents which cause losses that do not deliver power to the load, causing inefficient operation. For this reason, it is desirable to operate the system as close to unity power factor (e.g., as close to the center frequency $f_c$) as possible in order to eliminate reactive loads. As it turns out, only operation at the true resonant point is capable of providing a power factor close to unity. Adjusting the coupling between the source and the first resonator, between the first and second resonators, and between the second resonator and the load allows operation at the true resonant point with critical coupling (e.g., the point of maximum coupling before the peak begins to split). At critical coupling the load is properly reflected, through the transformer action of the coupled resonators, to the source, the power factor is nearly unity, and the system is stable since there is only one peak in the power throughput bandwidth.

From the previous discussion of FIGS. 10-14D, it can be seen that high Q operation provides higher throughput than low Q operation at large separation distances, but performs much less efficiently at smaller separation distances. Thus, high Q operation is only useful over a narrow range of relatively large resonator separation distances. In addition, under high Q operation, resonance is fragile and easily upset by changes in distance, alignment, frequency, loading conditions or nearby objects. By contrast, low Q operation provides broad and stable operation provides higher throughput and resonance stability than high Q operation for separation distances of between one-half resonator coil diameter and 0.

As was shown in the demonstration above, the goal of coupling energy from a power source to a load as efficiently as possible is not as simple as it seems. Tighter coupling makes the system more efficient and stable at close resonator separation distance, but has to opposite effect for larger separation. Looser coupling works at farther separation, but fails very quickly at closer separation.

With respect to a system for inductive resonant wireless charging of a chargeable device, the system may be broken down into four variables 1) coupling from the power source to the primary resonator, 2) air coupling between the first and second resonators, 3) coupling from the secondary resonator to the load, and 4) the load. The air coupling and the load are not under control of the system. For example, the device to be charged (e.g., the vehicle) may be moved or the battery may gradually charge to full capacity, each of which may change the load. Thus, the coupling between the power source and the primary resonator and the coupling between the secondary resonator and the load may be controlled by the system and are key control points for adjusting the operation of the system for maximum efficiency.

For every air coupling factor and load condition there may be a combination of adjustable couplings that result in critical coupling of the system and the most efficient power transfer. It is desirable that the coupling both from the power source to the primary resonator and from the secondary resonator to the load be adjusted when either the air coupling or the load changes, since changing only the primary side coupling or the secondary side coupling may not be sufficient to tune the system to the optimum operating point for producing critical coupling since both the coupling between the power source and the primary resonator and the coupling between the secondary resonator and the load affect the air coupling.

In some implementations, variation in power source and/or load impedances can be part of the adjustable coupling. Additionally, methods to change the impedance that the power source presents to the primary resonator or the impedance that the load presents to the secondary resonator may be useful. However, these methods tend to be limited in the range or resolution of adjustment. Accordingly, variation in source/load impedance may not be sufficient to cover desired operating conditions. In some low Q implementations, variation in loading or air coupling may be compensated by adjusting the drive of the power source to the primary resonator, which may be even more limited than the adjustment of source impedance described above. Thus, in some high Q operation implementations, there may be a need for adjusting the coupling between the power source and the primary resonator and between the secondary resonator and the load in order to achieve critical coupling from end-to-end. Accordingly, in some implementations, such as one illustrated in FIG. 15 below, practical high Q wireless power transfer systems may coordinate the adjustment of coupling between the power source and the primary resonator and the coupling between the secondary resonator and the load.

Figure 15:
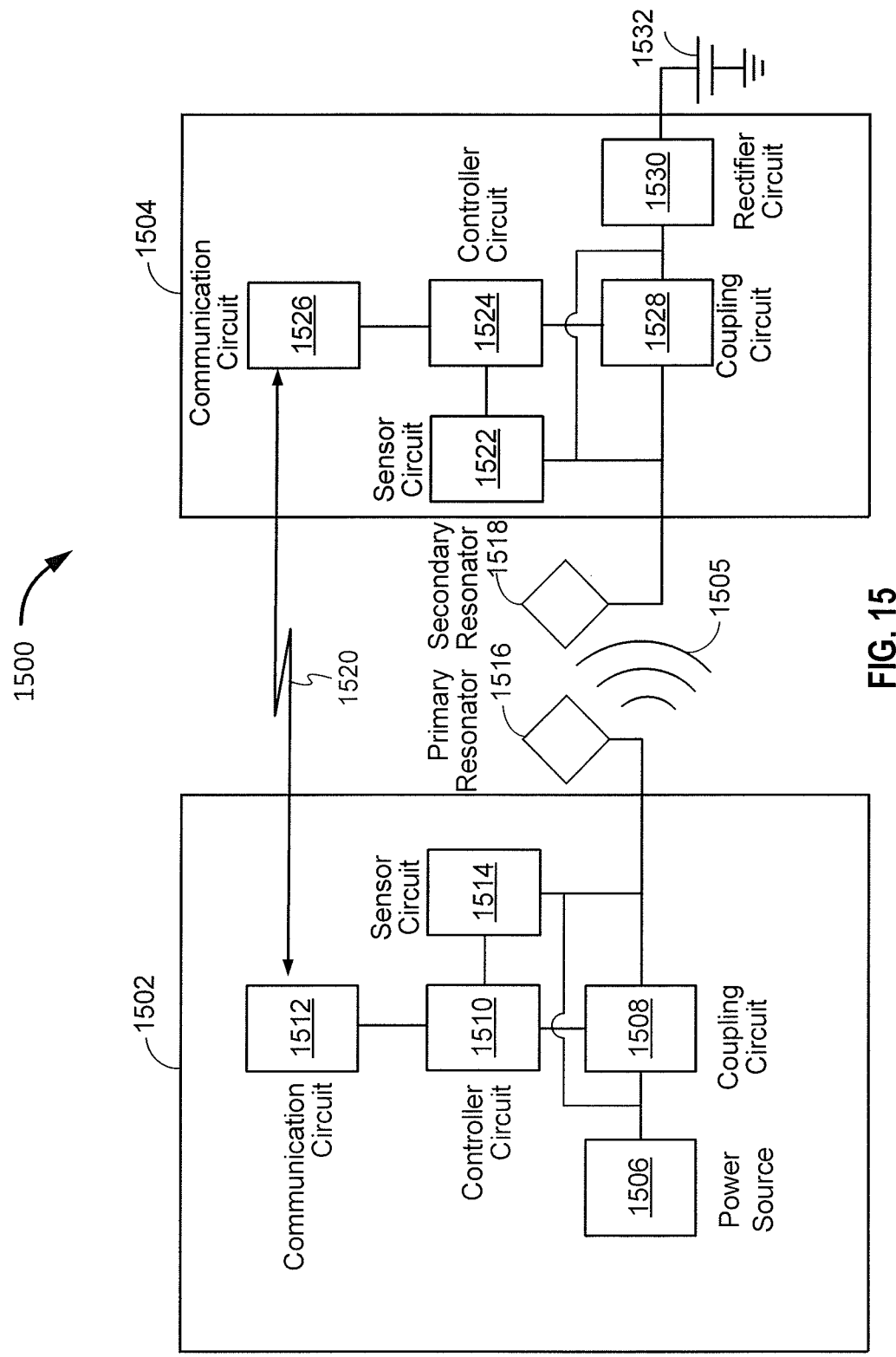
FIG. 15 is a functional block diagram of a wireless power transfer system having primary and secondary side coupling adjustment capability, in accordance with an exemplary implementation.

FIG. 15 is a functional block diagram of a wireless power transfer system 1500 having primary and secondary side coupling adjustment capability, in accordance with an exemplary implementation. The system 1500 may comprise a primary, charging or transmitter side 1502 and a secondary, chargeable or receiver side 1504. The transmitter side 1502 may comprise a power source 1506 connected to a coupling circuit 1508, which may be coupled to a primary resonator 1516. The transmitter side 1502 may further comprise a controller circuit 1514 connected to each of the coupling circuit 1508, a sensor circuit 1514 and a communication circuit 1512. The sensor circuit 1514 (e.g., a current sensor, a voltage sensor, a power sensor, a load sensor, a voltage or current phase sensor) may be configured to measure at least one parameter of the power throughput being coupled to the primary resonator 1516. The receiver side 1504 may comprise a secondary resonator 1518 coupled to a coupling circuit 1528, which is connected to a rectifier circuit 1530 and a controller circuit 1524. The rectifier circuit 1530 may be connected to a load 1532 (e.g., a battery or other charging circuit within a chargeable vehicle). The controller circuit 1524 may be additionally connected to a sensor circuit 1522 and a communication circuit 1526, which may be configured to communicate with the communication circuit 1512 of the transmitter side 1502 via a communications channel 1520. The sensor circuit 1522 may be configured to measure at least one parameter of the power throughput being coupled from the secondary resonator 1518.

According to some implementations, the coupling circuit 1508 between the power source 1506 and the primary resonator 1516 as well as the coupling circuit 1528 between the secondary resonator 1518 and the rectifier circuit 1530 and the load 1532 may be adjusted simultaneously, especially where the primary 1516 and secondary 1518 resonators are of similar configuration. The adjustments may be coordinated between the controller circuit 1510 of the transmitter side 1502 and the controller circuit 1524 of the receiver side 1504 via the communications channel 1520. The sensor circuits 1514 and 1522 may sense conditions at the transmitter side 1502 and the receiver side 1504, respectively, and communicate information regarding the sensed conditions to at least the respective controller circuits 1510 and 1524.

In some implementations, where the transmitter side 1502 is the master controller (e.g., directly controls the coordinated adjustment of the primary side coupling and indirectly controls the adjustment of the secondary side couplings), the transmitter side controller circuit 1510 may receive a first input from the sensor circuit 1514 to determine parameters of the power being coupled to the primary resonator 1516. Such parameters may include but are not limited to voltage, current, real power (Watts), reactive power (Volt-Amperes), phase angle between voltage and current, voltage drop across a sensing component (e.g., a resistor, capacitor, inductor etc.), current from a current transformer or any other measure of power. Likewise, the receiver side controller circuit 1524 may receive a first input from the sensor circuit 1522 to determine parameters of the power being coupled from the secondary resonator 1518. Such parameters may include but are not limited to voltage, current, real power (Watts), reactive power (Volt-Amperes), phase angle between voltage and current, voltage drop across a sensing component (e.g., a resistor, capacitor or inductor), current from a current transformer or any other measure of power.

The controller circuit 1510 may direct the communication circuit 1512 to send a communication to the communication circuit 1526, via the wireless communications channel 1520 (or via an in-band channel using the magnetic field generated by the primary resonator to communicate), to request an indication of the power parameters sensed by the sensor circuit 1522 on the receiver side 1504. In the alternative, the controller circuit 1524 may autonomously direct the communications circuit 1526 to transmit the indication of the power parameters sensed by the sensor circuit 1522 to the communications circuit 1512 over the communications channel 1520. Once received, the indication may be forwarded from the communications circuit 1512 to the controller circuit 1510. The controller circuit 1510 may then determine whether the coupling circuit 1508 should be increased (tightened) or decreased (loosened) based on the power throughput according to the above-described indications from the sensor circuits 1514 and 1522. The controller circuit 1510 may directly control the coupling circuit 1508 on the transmitter side 1502. The controller circuit 1510 may also indirectly control the coupling circuit 1528 of the receiver side 1504 by configuring the communication circuit 1512 to transmit one or more messages over the communications channel 1520 to the communication circuit 1526 instructing the controller circuit 1524 to adjust the coupling circuit 1528 in a particular direction.

In the successive control cycle, the controller circuit 1510 may receive a second set of indications from the sensor circuit 1514 and from the sensor circuit 1522 via the communication circuit 1526 by way of the communications circuit 1512 in the manner described above. The controller circuit 1510 may then determine whether the power throughput has improved or degraded, utilizing the previously set of indications as well as the current set of indications. Using standard control loop techniques, the controller circuit 1510 may repeat reception of the indications from the senor circuits 1522 and 1514 and adjustment of the coupling circuits 1508 and 1528 to adjust to and then maintain the optimum operating point.

Exemplary control loop techniques may include proportional, integral, proportional-derivative (PD), proportional-integral (PI), proportional-integral-derivative (PID) control, hysteresis, dead band, damping, set point ramping, feedforward, gain scheduling, integral disabling, integral bounding, fuzzy logic, or any other loop control technique or optimization. In some implementations, this wireless power transfer control may be further coordinated with load control and/or power source control. Such coordination may avoid degradation of the system because of step changes anywhere in the system. This coordination may trigger optimizations of the control loop by techniques mentioned above to better handle a change in system parameters or operation.

In some alternative implementations, where the receiver side 1504 controls the coordinated adjustment of the primary and the secondary side couplings, the above-described actions of the controller circuit 1510, the sensor circuit 1514 and the communication circuit 1512 may be swapped with those of the controller circuit 1524, the sensor circuit 1522 and the communication circuit 1526, respectively, and vice versa.

The above implementations are advantageous when the sizes and configuration of the primary and secondary resonators are similar. The implementations are simple, fast and require the least number of communications. If the sizes and configurations of the primary and secondary resonators are dissimilar, the following implementations may be advantageous.

Where the transmitter side 1502 controls the coordinated adjustment of the primary and the secondary side couplings, the transmitter side controller circuit 1510 may receive a first input from the sensor circuit 1514 to determine parameters of the power being coupled to the primary resonator 1516. The receiver side controller circuit 1524 may likewise receive a first input from the sensor circuit 1522 to determine parameters of the power being coupled from the secondary resonator 1518. For example, the controller circuit 1510 may configure the communications circuit 1512 to request, via the wireless communications channel 1520, that the controller circuit 1524 configures the communication circuit 1526 to send an indication of the parameters of the power being coupled from the secondary resonator 1518 to the communication circuit 1512. In some alternative implementations, the controller 1524 may autonomously configure the communication circuit 1526 to send the indication over the communication channel 1520 to the communication circuit 1512 to be forwarded to the controller circuit 1510. The controller circuit 1510 may then determine whether the coupling circuit 1508 should be increased (tightened) or decreased (loosened). In such implementations, the controller circuit 1510 may directly command the coupling circuit 1508 on the transmitter side 1502.

The controller circuit 1510 may then receive a second set of inputs (e.g., indications of sensed parameters of power transfer) from each of the sensor circuit 1514 and the sensor circuit 1522 in the manner described above. The controller circuit 1510 may determine from the first and the second sets of inputs (e.g., indications of sensed parameters of power transfer) if the power transfer has improved or degraded. As previously described, the controller 1510 may indirectly control the coupling circuit 1528 of the receiver side 1504 by sending a command or message via the communications channel 1520 for the controller circuit 1524 to adjust the coupling circuit 1528 on the receiver side 1504.

The controller circuit 1510 may additionally receive a third set of inputs (e.g., indications of sensed parameters of power transfer) from both the sensor circuit 1514 and the sensor circuit 1522 in the manner described above. The controller circuit 1510 may determine, utilizing the second and the third sets of inputs, if the power transfer has improved or degraded. Using standard control loop techniques, the controller circuit 1510 may control the coupling circuit 1508 and the coupling circuit 1528 to achieve and maintain the optimum operating point.

In some alternative implementations, where the receiver side 1504 controls the coordinated adjustment of the primary and the secondary side couplings, the above-described actions of the controller circuit 1510, the sensor circuit 1514 and the communication circuit 1512 may be swapped with those of the controller circuit 1524, the sensor circuit 1522 and the communication circuit 1526, respectively, and vice versa. The coupling circuits 1508 and 1528 may comprise one of any number of physical arrangements as will be described in more detail in connection with FIGS. 16-23 below.

Figure 16:
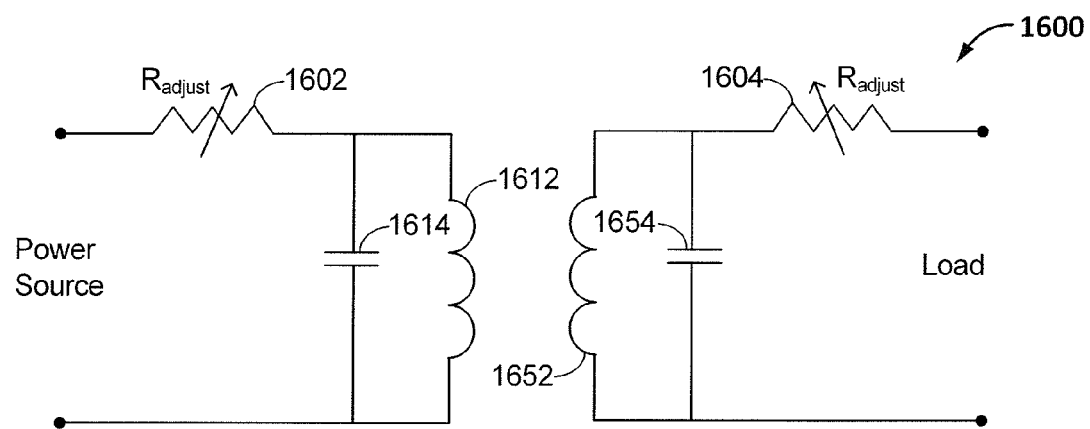
FIG. 16 is a schematic diagram of a portion of a coupling circuit of FIG. 15 utilizing variable resistive coupling, in accordance with an exemplary implementation.

FIG. 16 is a schematic diagram of a portion of a coupling circuit of FIG. 15 utilizing variable resistive coupling, in accordance with an exemplary implementation. For simplicity, the following discussions for each of FIGS. 16-23 assume the same type of coupling circuit implementation is used on both the primary and secondary sides and that adjustment is made to the primary and secondary sides.

Some implementations for providing adjustable coupling between the power source and the primary resonator or between the secondary resonator and the load utilize a variable resistor separating the source or load from the respective resonator. For example, the coupling circuit 1600 illustrates a primary or transmitter side coupling circuit and a secondary or receiver side coupling circuit. The primary or transmitter side may comprise an adjustable resistor 1602 connected to the primary resonator comprising at least an inductor 1612 connected to a capacitor 1614. The secondary or receiver side may comprise an adjustable resistor 1604 connected to the secondary resonator comprising at least an inductor 1652 connected to a capacitor 1654. Adjusting the variable resistor 1602 and the variable resistor 1604 to low resistance values allows the source and load, respectively, to reduce the operating Q of the wireless power transfer system. This may be advantageous where the primary and secondary resonators are in close proximity. Adjusting the variable resistors 1602 and 1604 to a high resistance value isolates the primary and secondary resonators, respectively, and allows operation at a higher Q value. This may be advantageous where the resonators are far apart. However, a major drawback of using resistors is that power is dissipated in the resistors, which leads to lowered efficiency.

Figure 17:
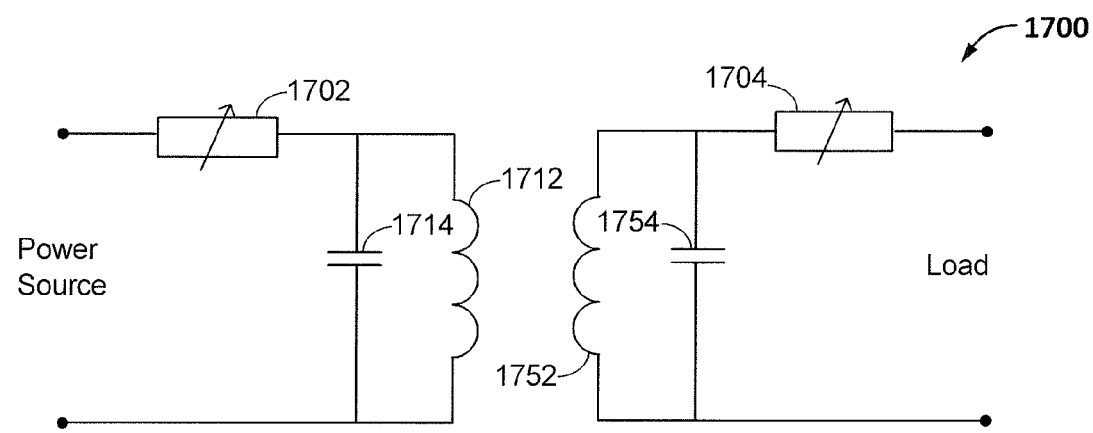
FIG. 17 is a schematic diagram of a portion of a coupling circuit of FIG. 15 utilizing variable reactive coupling, in accordance with an exemplary implementation.

FIG. 17 is a schematic diagram of a portion of a coupling circuit of FIG. 15 utilizing variable reactive coupling, in accordance with an exemplary implementation. The coupling circuit 1700 illustrates the primary or transmitter side coupling circuit and the secondary or receiver side coupling circuit, similarly to that shown in FIG. 16. However, a more efficient solution than that shown in FIG. 16, where adjustable resistors 1602 and 1604 are utilized as the adjustable coupling, is to replace the adjustable resistors 1602 and 1604 with variable reactive components (e.g., inductors or capacitors) 1702 and 1704, respectively. The magnitude of the reactance of the reactive components may equal the magnitude of the resistance of the adjustable resistors 1602 and 1604 at the frequency of operation. The primary or transmitter side may comprise an adjustable reactive component (e.g., inductor or capacitor) 1602 connected to the primary resonator comprising at least an inductor 1712 connected to a capacitor 1714. The secondary or receiver side may comprise an adjustable reactive component (e.g., inductor or capacitor) 1704 connected to the secondary resonator comprising at least an inductor 1752 connected to a capacitor 1754. However, making the inductors or capacitors variable may be difficult. Switching between taps of an inductor or between multiple capacitors may provide step-wise variable reactance in such an implementation. Other, more complex networks of reactive elements may be used to provide the adjustable coupling function, as well as impedance matching and harmonic filtering. However, making such multi-function networks variable may require increased complexity and cost as well as reduced efficiency.

Figure 18:
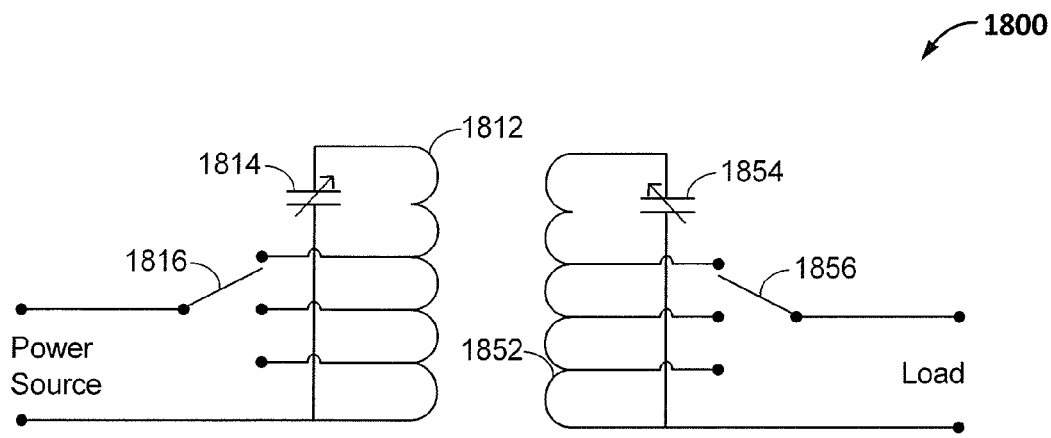
FIG. 18 is a schematic diagram of a portion of a coupling circuit of FIG. 15 utilizing tapped inductor coupling, in accordance with an exemplary implementation.

FIG. 18 is a schematic diagram of a portion of a coupling circuit of FIG. 15 utilizing tapped inductor coupling, in accordance with an exemplary implementation. In some implementations, another way to provide adjustable coupling is to select one of a plurality of taps on the resonators' inductors. Such implementations take advantage of the reactive elements that are already part of the resonators. For example, the coupling circuit 1800 illustrates a primary or transmitter side coupling circuit and a secondary or receiver side coupling circuit. The primary or transmitter side may comprise an inductor 1812 connected to an adjustable capacitor 1814. A first terminal of the power source may be connected to one terminal of the inductor 1812, while the second terminal of the power source may be configured to be connected to one of a plurality of taps disposed along distinct locations on the inductor 1812 via a switch 1816. The secondary or receiver side may likewise comprise an inductor 1852 connected to an adjustable capacitor 1854. A first terminal of the load (or some intervening circuit or module between the secondary side coupling and the load) may be connected to one terminal of the inductor 1852, while the second terminal of the load (or some intervening circuit or module between the secondary side coupling and the load) may be configured to be connected to one of a plurality of taps disposed along distinct locations on the inductor 1852 via a switch 1856. Using a high tap on the inductors 1812 and 1852 allows the source and load to reduce the operating Q of the system for close resonator operation. Using a low tap on the inductors 1812 and 1852 isolates the resonators and allows operation at a higher Q for greater distance operation. This implementation may offer high efficiency, however, tapping into the resonator changes the resonant frequency, which requires the variable capacitor to adjust resonance (e.g., to maintain the resonant frequency of the resonator constant). Also, this method requires high voltage, low loss switches because they are switching circulating currents in each of the resonators.

Figure 19:
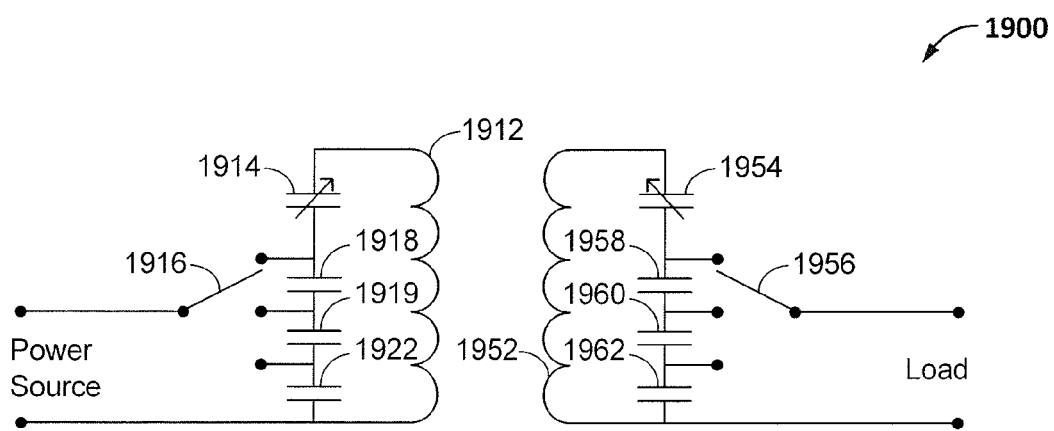
FIG. 19 is a schematic diagram of a portion of a coupling circuit of FIG. 15 utilizing tapped capacitor coupling, in accordance with an exemplary implementation.

FIG. 19 is a schematic diagram of a portion of a coupling circuit of FIG. 15 utilizing tapped capacitor coupling, in accordance with an exemplary implementation. The coupling circuit 1900 illustrates a primary or transmitter side coupling circuit and a secondary or receiver side coupling circuit. The primary or transmitter side may comprise an inductor 1912 connected to an adjustable capacitor 1914 and a plurality of tapped capacitors 1918, 1920, 1922 connected in series (e.g., series-connected capacitors). A first terminal of the power source may be connected to one terminal of the inductor 1912, while the second terminal of the power source may be configured to be connected to one of a plurality of taps disposed between the tapped capacitors 1918, 1920, 1922 via a switch 1916. The secondary or receiver side may likewise comprise an inductor 1952 connected to an adjustable capacitor 1954 and a plurality of tapped capacitors 1918, 1920, 1922 connected in series. A first terminal of the load (or some intervening circuit or module between the secondary side coupling and the load) may be connected to one terminal of the inductor 1952, while the second terminal of the load (or some intervening circuit or module between the secondary side coupling and the load) may be configured to be connected to one of a plurality of taps disposed between the tapped capacitors 1958, 1960, 1962 via a switch 1956. Using a high tap on the stacked capacitors allows the source and load to reduce the operating Q of the system for close resonator operation. Using a low tap on the stacked capacitors isolates the resonators and allows operation at a higher Q for greater distance operation. This implementation may offer high efficiency. However, tapping into the resonator changes the resonant frequency, which requires a variable capacitor to adjust resonance. In addition, variable capacitors that can withstand the high voltage found in a high Q resonator and provide the large capacitance value required may be very expensive. Moreover, because the capacitors are in series, this implementation requires a series stack of larger value capacitors than the adjustable capacitor 1914/1954 required to resonate with the inductor 1912/1952. This implementation also requires high voltage, low loss switches because they are switching circulating currents in the resonator.

Figure 20:
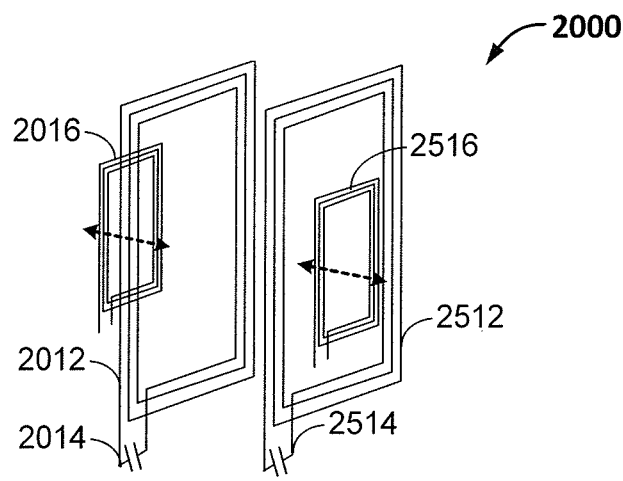
FIG. 20 is a schematic diagram of a portion of a coupling circuit of FIG. 15 utilizing physically adjustable coupling, in accordance with an exemplary implementation.

FIG. 20 is a schematic diagram of a portion of a coupling circuit of FIG. 15 utilizing physically adjustable coupling, in accordance with an exemplary implementation. Instead of utilizing direct connection to the resonators, some implementations utilize an inductive coupling loop for coupling power into and out of the primary and secondary resonators, respectively. Such implementations may correspond directly to the apparatus shown in FIGS. 5 and 16. The coupling circuit 2000 may comprise a primary or transmitter side and a secondary or receiver side. The primary or transmitter side may comprise a resonator comprising an inductor 2012 connected in series with a capacitor 2014. The transmitter side may additionally include a coupling loop 2016 that is configured to be physically moved closer to or farther from the resonator comprising the inductor 2012 and the capacitor 2014. The secondary or receiver side may comprise a resonator comprising an inductor 2052 connected in series with a capacitor 2054. The receiver side may additionally include a coupling loop 2056 that is configured to be physically moved closer to or farther from the resonator comprising the inductor 2052 and the capacitor 2054. The coupling loops 2016/2056 may or may not be resonant by themselves. In simple systems the inductive coupling loops 2016/2056 are non-resonant and only the larger L-C resonators are resonant. In the case of very high Q systems, the inductive coupling loops 2016/2056 may be made resonant for step up and step down to and from, respectively, very high voltages in the resonators.

In some implementations, the inductive coupling loop 2016 is directly connected to the power source on the primary side while the inductive coupling loop 2056 is directly connected to the load on the secondary side. Thus, there are no galvanic connections between the inductive coupling loops and the resonators. The inductive coupling loops 2016 and 2056 are positioned proximate to the respective resonators such that magnetic flux is shared between the coupling loops and the respective resonators. Because the inductive coupling loops 2016 and 2056 and the resonators are galvanically isolated from one another, the engineer is free to optimize each without regard for coupling or impedance matching other than by shared flux. For example, the ratio of reactance values for the inductors 2012/2052 and the capacitors 2014/2054 may be selected for optimum magnetic field generation or reception, while the inductive coupling loops 2016/2056 may be designed for best impedance match to the source and load, respectively. The inductive coupling loop 2016 and the resonator (e.g., the inductor 2012 in combination with the capacitor 2014) form a transformer, so the turns ratio of the transformer can be advantageous for matching dissimilar impedances of the resonator and source or load.

To be useful in a high Q wireless power transfer system, the coupling between the inductive coupling loops 2016/2056 and the respective resonators must be adjustable. One way to provide adjustable coupling is simply to move the coupling loops 2016/2056 closer or farther from their respective resonator. Another alternative is to turn the coupling loops 2016/2056 such that their cross sections lie in a plane that is not parallel to the plane of the cross section of the resonator to reduce coupling. Such an alternative reduces the coupling by reducing the effective cross section of the coupling loops 2016/2056 as "seen" by the respective resonators with respect to magnetic flux. However, this scheme requires mechanical parts, such as motors and belts, to move the loops as well as flexible wires and clearance to move the coupling loops 2016/2056 back and forth or to rotate the coupling loops 2016/2056. Other physical adjusting implementations of the coupling loop may involve moving ferrite materials to adjust the coupling between the coupling loops and the resonators.

Figure 21:
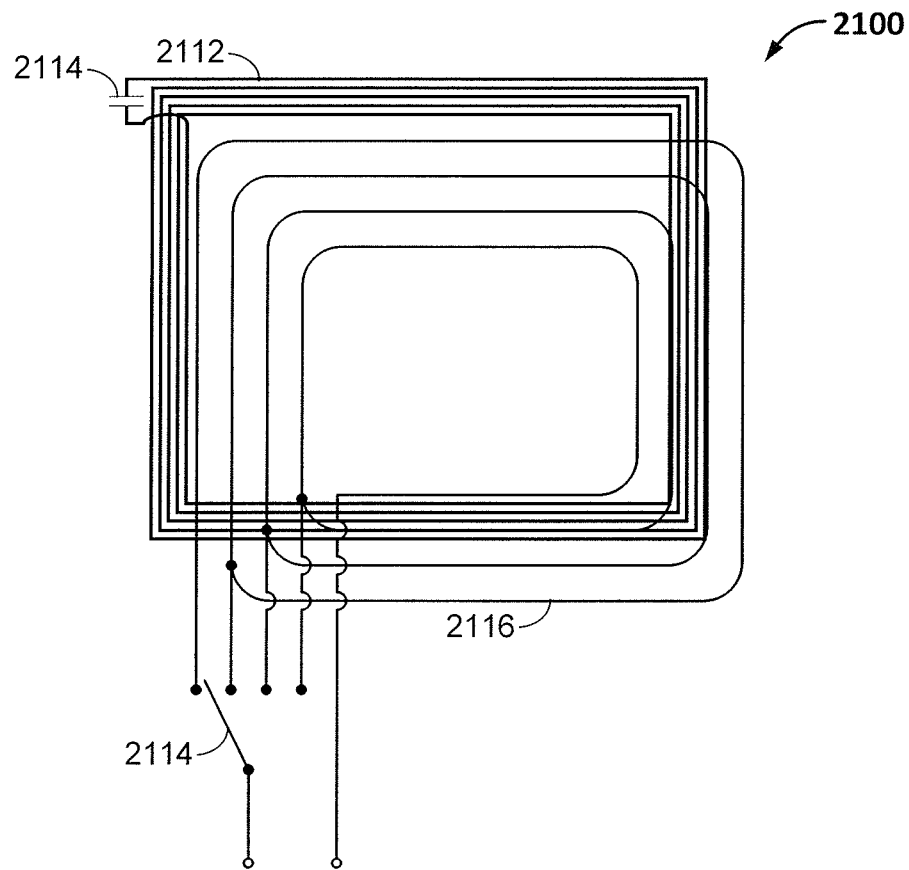
FIG. 21 is a schematic diagram of a portion of a coupling circuit of FIG. 15 utilizing a tapped coupling loop, in accordance with an exemplary implementation.

FIG. 21 is a schematic diagram of a portion of a coupling circuit of FIG. 15 utilizing a tapped coupling loop, in accordance with an exemplary implementation. Such implementations may also correspond directly to the apparatus shown in FIGS. 5 and 15. A method for adjustable coupling may utilize a tapped coupling loop arrangement. The implementation 2100 comprises a tapped coupling loop 2116 that overlays or underlays, but is electrically isolated from, an associated resonator comprising an inductor 2112 and a capacitor 2114. In some implementations, the resonator has no other physical connections. To adjust the amount of flux shared between the tapped coupling loop 2116 and the resonator, a switch 2114 may be configured to connect one terminal of the tapped coupling at one of a plurality of taps connected along disparate locations on the turns of the coupling loop 2116. In some implementations, each of the turns of the coupling loop 2116 may have substantially the same cross sectional area as one another. The switch 2114 selects a number of turns (e.g., segments) of the tapped coupling loop 2116 that are configured to be connected (e.g., the loops, turns or segments are electrically connectable) to the terminals of the tapped coupling loop 2116. The terminals are the input for connection to the power source on the primary (e.g., transmitter) side, or the output for connection to the load on the secondary (e.g., receiver) side. The tapped coupling loop 2116 may be configured for tighter or looser coupling with the resonator by selecting a position of the switch 2114 for more or fewer turns (e.g., segments). More turns (e.g., segments) provide tighter coupling and a lower transformer turns ratio. Fewer turns (e.g., segments) provide looser coupling and a higher turns ratio. For wide separation between primary and secondary a single turn (e.g., segment) may be selected for loose coupling and very high Q operation. For small separation multiple turns (e.g., segments) may be selected for tighter coupling and lower Q operation to avoid over coupling of the system.

The tapped coupling loop 2116 has a minimal effect on the resonant frequency of the resonator 2112/2114 because there is no direct electrical connection between the two. This avoids a requirement of retuning the resonator 2112/2114 when the coupling is changed since the coupling is only by shared flux. The tapped coupling loop 2116 does not carry high circulating currents as does the resonator, but instead only carries the current coupled from the source into the resonator 2112/2114 or from the resonator 2112/2114 to the load. In addition, when operated at resonance, the reactive currents in the tapped coupling loop 2116 are very small, leaving only the real current that does useful work. Similarly, because all switching is performed at the tapped coupling loop 2116 instead of directly at the resonator 2112/2114, there are no switches in the high voltage, high current resonator windings. Another advantage of such an implementation is that the transformer action between the tapped coupling loop 2116 and the resonator 2112/2114, and switching to the optimum coupling results in much smaller variation ranges in the impedance seen by the power source or load at the terminals as compared with the other above-mentioned coupling implementations. As such, with operation at resonance, the impedance of the load (voltage and current in phase) will be reflected through the coupling between the load and the secondary resonator, through the air coupling, through the coupling from the primary resonator and presented to the power source at very close to the impedance of the real load. Such operation at a power factor close to unity has the advantage of efficient operation, low operational stress on components (except for those in the resonators themselves), no requirement for tuning the resonators, and simple low voltage, low current switching.

Figure 22:
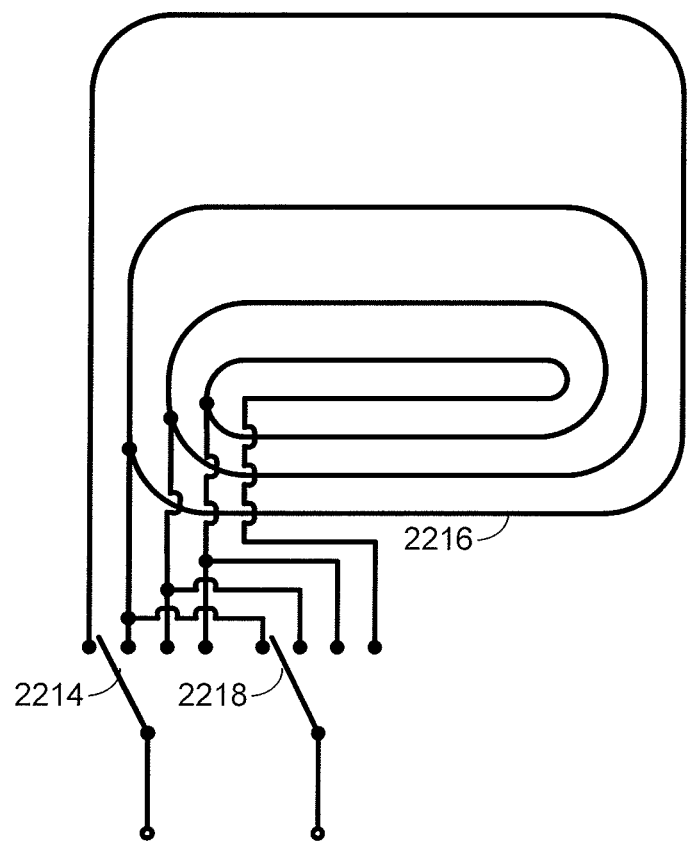
FIG. 22 is a schematic diagram of a portion of a coupling circuit of FIG. 15 utilizing a tapped coupling loop having geometrically graduated loop sizes, in accordance with an exemplary implementation.

FIG. 22 is a schematic diagram of a portion of a coupling circuit of FIG. 15 utilizing a tapped coupling loop having geometrically graduated loop sizes, in accordance with an exemplary implementation. The tapped coupling loop 2116 described above in connection with FIG. 21 had turns of approximately the same size. However, a wider range of coupling selection may be achieved by utilizing a coupling loop 2216 having different size turns (e.g., segments) arranged in geometrically graduated sizes, as shown in FIG. 22. A first loop or segment of the coupling loop 2216 would be of a small cross sectional area or size. The second loop or segment (when two turns are selected) would have a larger cross sectional area than that of the first (e.g., in some implementations, approximately double the size of the first loop). A third loop or segment may again have a larger cross sectional area than the second loop or segment (e.g., in some implementations, double the size of the second loop). However, the ratio of cross sections or sizes could be any ratio that provides the changes desired for adjusting coupling. Accordingly, a cross sectional area of adjacent segments of the plurality of segments may increase from a first segment to a last segment of the coupling loop 2116. Since the mechanism of coupling between the tapped coupling loop 2216 and the resonator (not shown in FIG. 22) is sharing of flux, different sized turns or segments capture a different amount of flux. Two same sized turns or segments capture twice the flux of one turn or segment. A turn or segment twice the size of the first captures twice the flux. By selecting different numbers of turns or segments and different ratios of sizes, a great variety of coupling factors may be achieved. For finer resolution of steps, switches (e.g., the switches 2214 and 2218) may be positioned to disconnect or short portions (e.g., segments) of turns. The switches 2314 and 2318 may be set independently to connect or disconnect different combinations of larger and smaller turns or portions of turns. Care must be taken with this approach to avoid the control lines of the switches coupling to the magnetic field by using decoupling chokes. In operation of the geometric tapped coupling loop 2216, the smallest turn (loop or segment) would allow for very high Q operation with loose coupling and a high transformer ratio to accommodate very large separation between the resonators. Selecting more and larger turns or segments tightens the coupling and reduces the transformer ratio for lower Q and closer resonator separation distance.

The techniques and methods described herein provide the wireless power transfer system designer with several alternatives offering a wide range of operation while maintaining high efficiency, simple and straight forward circuit design and high Q operation with low stress on the components. Coordinated adjustment of coupling between the power source and the primary resonator and between the secondary resonator and the load allows power to be efficiently transferred over a long distance while also accommodating closer resonator separation distance and/or accommodating variations in the load.

Figure 23:
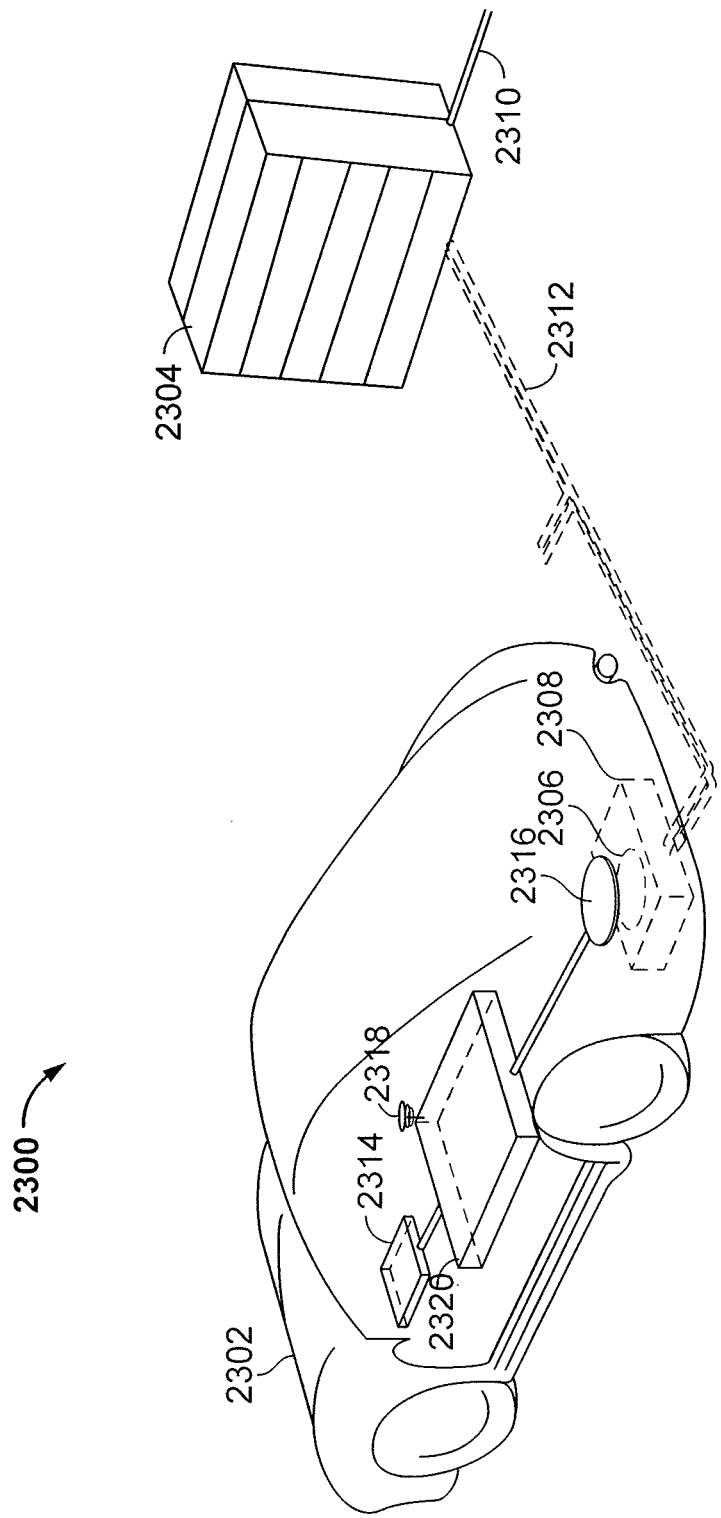
FIG. 23 is a diagram of a vehicle aligned over a primary resonator, in accordance with an exemplary implementation.

FIG. 23 is a diagram of a vehicle 2302 aligned over a primary resonator, in accordance with an exemplary implementation. The wireless power transfer system 2300 enables charging of the vehicle 2302 while the vehicle 2302 is parked near the transmitter 2304. Although the transmitter 2304 is shown spatially separated from the base pad 2308, the present application is not so limited and the transmitter 2304 may be located at any other location, including substantially the same location as the base pad 2308. Space is shown for the vehicle 2302 to be parked over the primary resonator 2306, which may correspond to the primary resonator 512 of FIG. 5 for example. The primary resonator 2306 may be located within a base pad 2308. In some implementations, the transmitter 2304 may be connected to a power backbone 2310. The transmitter 2304 may be configured to provide an alternating current (AC), through an electrical connection 2312, to the primary resonator 2306 located within the base pad 2308. As previously described in connection with FIG. 15, the vehicle 2302 may include a battery 2314, a secondary resonator 2316, and an antenna 2318 (e.g., as a part of a communication module or circuit) each connected to the receiver 2320.

In some implementations, the secondary resonator 2316 may receive power when the secondary resonator 2316 is located in a wireless (e.g., magnetic) field produced by the primary resonator 2306. In some implementations, the secondary resonator 2316 may correspond to the secondary resonator 552 of FIG. 5. The wireless field (not shown) corresponds to a region where magnetic energy output by the primary resonator 2306 may be captured by the secondary resonator 2316. In some cases, the wireless field may correspond to the "near field" of the primary resonator 2306. The coordinated adjustment of coupling as described above with reference to FIGS. 15-22 may be implemented by the system as shown in FIG. 23. In this case, power on the order of one or multiple kilowatts may be transferred for charging the battery 2314 of the vehicle 2302. In addition, the coordinated adjustment of coupling as described above with reference to FIGS. 15-22 may be implemented in a system for wirelessly providing power for powering or charging portable electronic devices as described above. For example, such a system may include a single or multiple device charging pad that wirelessly charges one or more portable devices located within a charging region such as on a pad or located within a room or other area. In this case, power may be transferred to a portable electronic device on the order of ~1 watt to 50-60 watts.

Figure 24:
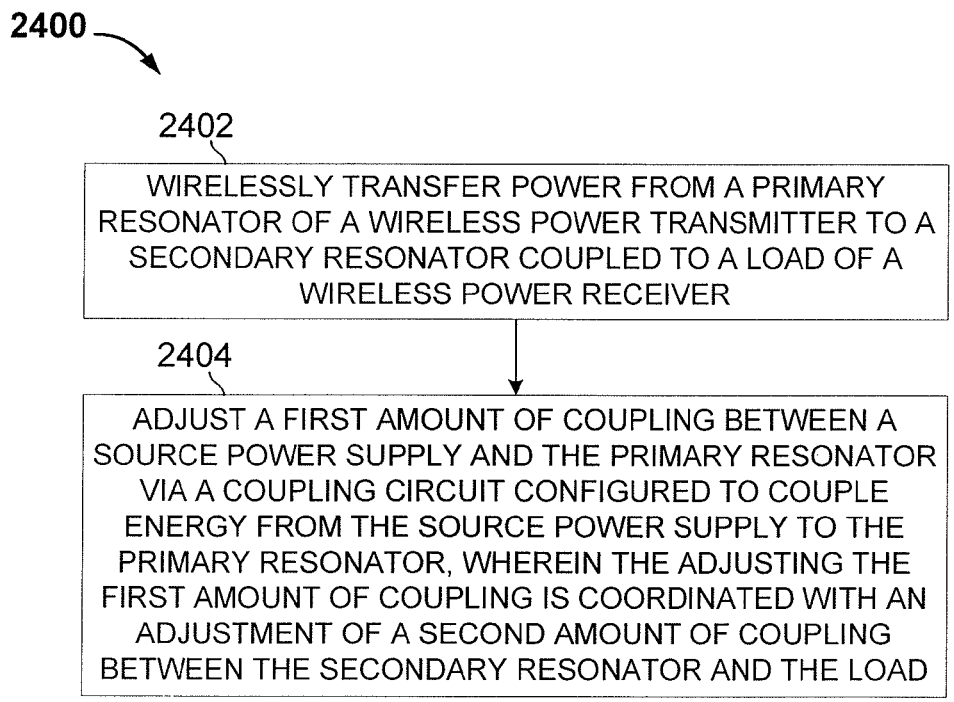
FIG. 24 shows a flowchart of a method for wireless inductive power transfer, in accordance with an exemplary implementation.

FIG. 24 shows a flowchart of a method 2400 for wireless inductive power transfer, in accordance with an exemplary implementation. The method 2400 may begin with block 2402, which includes wirelessly transferring power from a primary resonator of a wireless power transmitter to a secondary resonator coupled to a load of a wireless power receiver. For example, as previously described in connection with at least FIGS. 5 and 15, wireless power may be transmitted between the primary resonator 512/1516 and the secondary resonator 552/1518.

The method 2400 may then proceed to block 2404, which includes adjusting a first amount of coupling between a source power supply and the primary resonator via a coupling circuit configured to couple energy from the source power supply to the primary resonator, wherein the adjusting the first amount of coupling is coordinated with an adjustment of a second amount of coupling between the secondary resonator and the load. For example, as previously described in connection with at least FIGS. 5 and 15, the controller circuit 1510 may coordinate the adjustment of a coupling between the power source 504/1506 and the primary resonator 512/1516, via the coupling circuit 511/1508, with the adjustment of a coupling between the secondary resonator 552/1518 and the load 560/1532.

Figure 25:
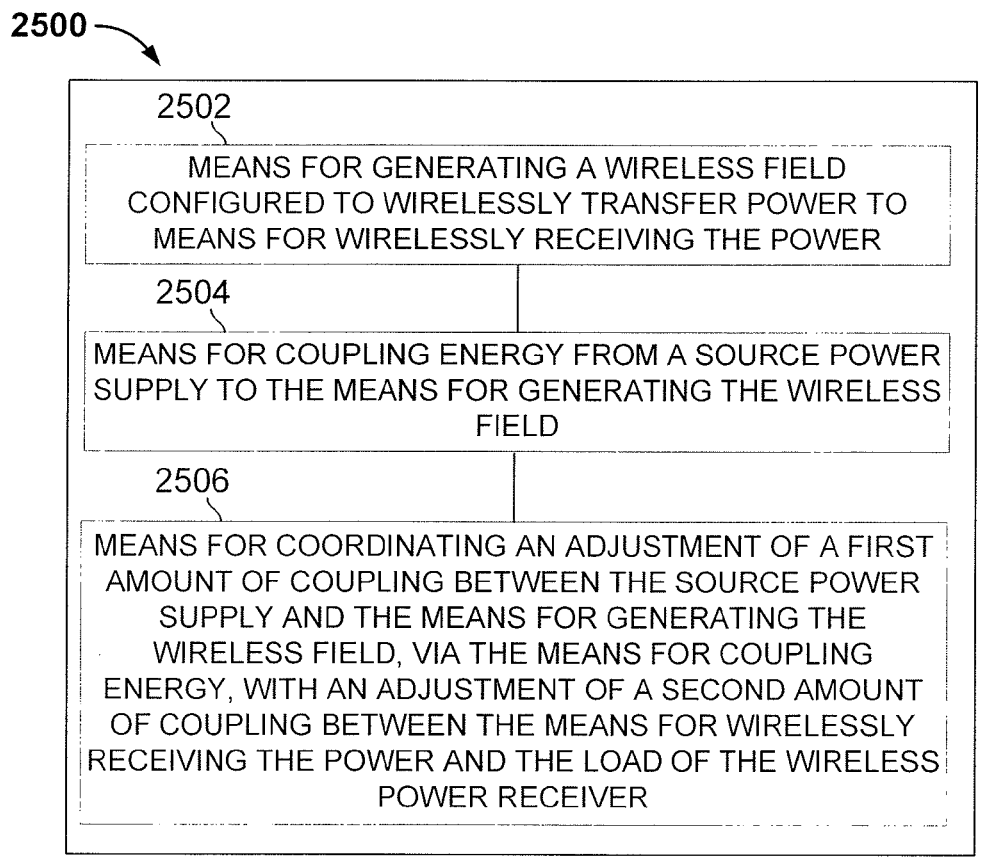
FIG. 25 is a functional block diagram of an apparatus for wireless inductive power transfer, in accordance with an exemplary implementation.

FIG. 25 is a functional block diagram of an apparatus 2500 for wireless inductive power transfer, in accordance with an exemplary implementation. The apparatus 2500 comprises means 2502, means 2504 and means 2506 for the various actions discussed with respect to at least FIGS. 5, 15 24. The apparatus 2500 includes means 2502 for generating a wireless field configured to wirelessly transfer power to means for wirelessly receiving the power. The means for wirelessly receiving the power may be coupled to a load of a wireless power receiver. In an implementation, means 2502 can be configured to perform one or more of the functions discussed above with respect to block 2402 of FIG. 24. In various implementations, means 2502 can be implemented by the primary resonator 512/1516 (FIGS. 5/15).

The apparatus 2500 further includes means 2504 for coupling energy from a source power supply to the means 2502 for generating the wireless field. In an implementation, means 2504 may be configured to perform one or more of the functions discussed above with respect to block 2402 of FIG. 24. In various implementations, the means 2504 can be implemented by the coupling circuit 511/1508 (FIGS. 5/15).

The apparatus 2500 further includes means 2506 for coordinating an adjustment of a first amount of coupling between the source power supply and the means 2502 for generating the wireless field, via the means 2504 for coupling energy, with an adjustment of a second amount of coupling between the means for wirelessly receiving the power and the load of the wireless power receiver. In an implementation, means 2506 may be configured to perform one or more of the functions discussed above with respect to block 2404 of FIG. 24. In various implementations, the means 2506 can be implemented by at least the controller circuit 1510 (FIG. 15).

Figure 26:
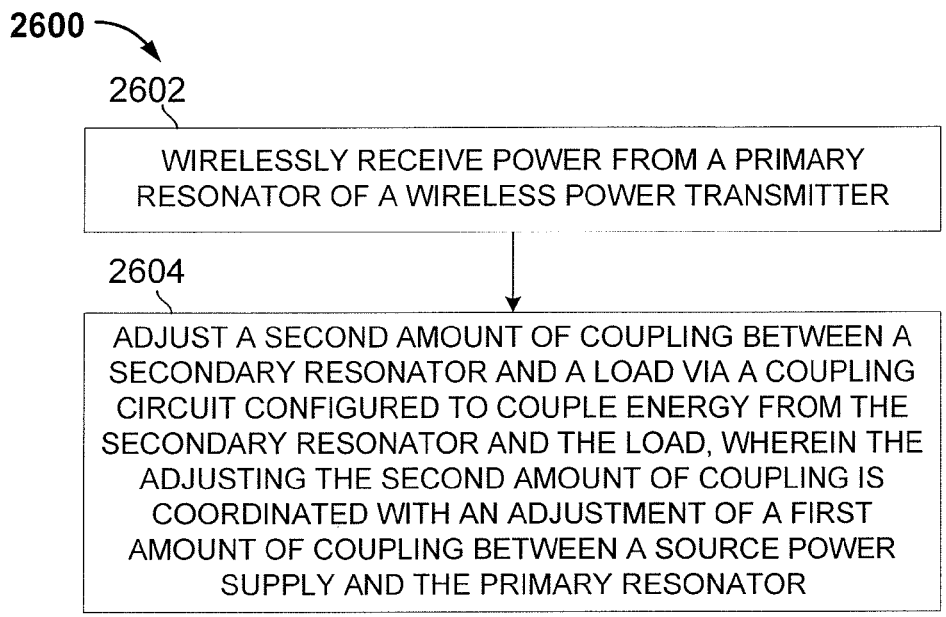
FIG. 26 shows a flowchart of a method for inductively receiving power wirelessly, in accordance with an exemplary implementation.

FIG. 26 shows a flowchart of a method 2600 for inductively receiving power wirelessly, in accordance with an exemplary implementation. The method 2600 may begin with block 2602, which includes wirelessly receive power from a primary resonator of a wireless power transmitter. For example, as previously described in connection with at least FIGS. 5 and 15, wireless power may be received from the primary resonator 512/1516 by the secondary resonator 552/1518.

The method 2600 may then proceed to block 2604, which includes adjusting a second amount of coupling between a secondary resonator and a load via a coupling circuit configured to couple energy from the secondary resonator and the load, wherein the adjusting the second amount of coupling is coordinated with an adjustment of a first amount of coupling between a source power supply and the primary resonator. This operation may be carried out as previously described in connection with FIG. 15, for example.

Figure 27:
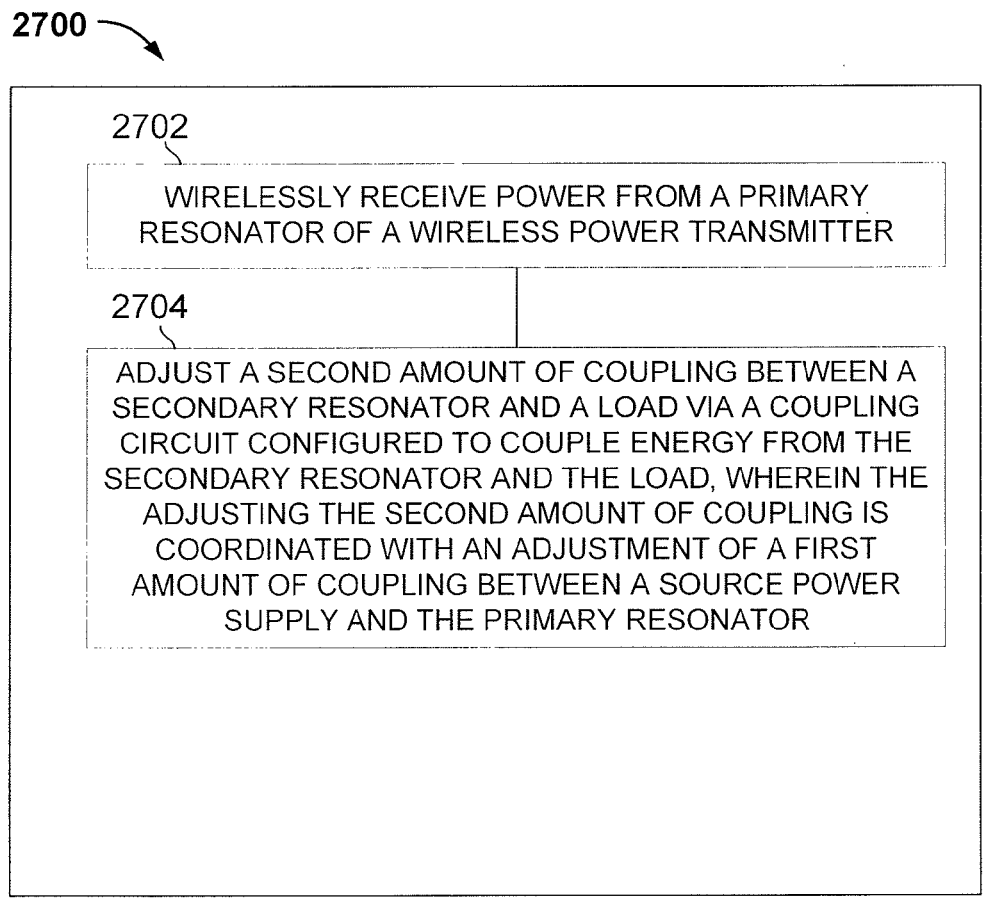
FIG. 27 is a functional block diagram of an apparatus for receiving wireless power inductively, in accordance with an exemplary implementation.

FIG. 27 is a functional block diagram of an apparatus 2700 for receiving wireless power inductively, in accordance with an exemplary implementation. The apparatus 2700 comprises means 2702, means 2704 and means 2706 for the various actions discussed with respect to at least FIGS. 5, 15 26. The apparatus 2700 includes means 2702 for receiving power from means for generating a wireless field 2502 of a wireless power transmitter 2500. In an implementation, means 2702 can be configured to perform one or more of the functions discussed above with respect to block 2602 of FIG. 26. In various implementations, means 2702 can be implemented by the secondary resonator 552/1518 (FIGS. 5/15).

The apparatus 2700 further includes means 2704 for coupling energy from the means for receiving power 2702 to a load. In an implementation, means 2704 may be configured to perform one or more of the functions discussed above with respect to block 2602 of FIG. 26. In various implementations, the means 2704 can be implemented by the coupling circuit 551/1528 (FIGS. 5/15).

The apparatus 2700 further includes means 2706 for coordinating an adjustment of a second amount of coupling between the means 2702 for receiving power and the load, via the means 2704 for coupling energy, with an adjustment of a first amount of coupling between a source power supply and the means 2602 for generating the wireless field of the wireless power transmitter 2600. In an implementation, means 2706 may be configured to perform one or more of the functions discussed above with respect to block 2604 of FIG. 26. In various implementations, the means 2706 can be implemented by at least the controller circuit 1524 (FIG. 15).

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations of the invention.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor may read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular implementation of the invention. Thus, the invention may be embodied or carried out in a manner that achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the invention. Thus, the present invention is not intended to be limited to the implementations shown herein but is to be accorded the widest scope consistent with the principles and novel features disclosed herein.

What is claimed is:

1. An apparatus for wireless inductive power transfer, comprising:
    a primary resonator configured to wirelessly transfer power to a secondary resonator coupled to a load of a wireless power receiver;
    a coupling circuit configured to couple energy from a source power supply to the primary resonator; and
    a controller configured to:
        receive, from the wireless power receiver, an indication of one of a power throughput of power delivered to the load or an efficiency of power experienced by the load, and
        adjust, based at least in part on the received indication, a degree of coupling between the source power supply and the primary resonator, via the coupling circuit, based on an adjustment of a degree of coupling between the secondary resonator and the load of the wireless power receiver,
        wherein the primary resonator is configured to resonate at a first frequency and the controller is configured to adjust the degree of coupling between the source power supply and the primary resonator while maintaining resonance of the primary resonator at the first frequency.

2. The apparatus of claim 1, wherein the degree of coupling between the coupling circuit and the primary resonator is adjusted to change an operating quality factor of the primary resonator and increase at least one of a power factor presented by the coupling circuit to the source power supply, an amount of power transferred to the load, an efficiency of power transferred to the load, or any combination thereof.

3. The apparatus of claim 1, wherein:
    the coupling circuit comprises a first coupling loop comprising a plurality of segments, each configured to be selectively electrically connected to the source power supply, the first coupling loop electrically isolated from the primary resonator; and
    the controller is configured to adjust the first amount of coupling by selectively connecting at least a subset of the plurality of segments to the first coupling loop.

4. The apparatus of claim 3, wherein a cross sectional area of adjacent segments of the plurality of segments increases from a first segment to a last segment of the first coupling loop.

5. The apparatus of claim 3, wherein the controller is configured to adjust the first amount of coupling by adjusting at least one of:
    a coefficient of coupling between the first coupling loop and the primary resonator; or
    a ratio of mutual inductance between the first coupling loop and the primary resonator to a leakage inductance of the first coupling loop, or a combination thereof.

6. The apparatus of claim 1, wherein:
    the coupling circuit comprises a switch configured to selectively connect the source power supply to either:
        one of a plurality of locations, each connected to a corresponding one of a plurality of series-connected capacitors of the primary resonator; or
        one of a plurality of locations on an inductor of the primary resonator; and
    the controller is configured to adjust the first amount of coupling by selectively connecting the source power supply to one of the plurality of locations.

7. The apparatus of claim 1, wherein the controller is further configured to transmit a message to the wireless power receiver instructing the wireless power receiver to adjust the degree of coupling between the secondary resonator and the load.

8. The apparatus of claim 1, wherein the controller is configured to adjust the first amount of coupling to be equal to an amount of coupling between the primary resonator and the secondary resonator.

9. The apparatus of claim 1, further comprising a sensor configured to measure at least one parameter of power throughput between the source power supply and the primary resonator, and wherein the controller is configured to, in coordinating the adjustment of the first amount of coupling with the adjustment of the second amount of coupling:
    receive a first indication of the at least one parameter of power throughput from the sensor and a first indication of at least one parameter of power throughput between the secondary resonator and the load from the wireless power receiver;
    adjust the first amount of coupling and instruct the wireless power receiver to adjust the second amount of coupling;
    receive a second indication of the at least one parameter of power throughput from the sensor and a second indication of the at least one parameter of power throughput from the wireless power receiver; and
    determine whether to adjust the first amount of coupling and whether to instruct the wireless power receiver to adjust the second amount of coupling based at least in part on a comparison of the first and second indications from each of the sensor and the wireless power receiver.

\* \* \* \* \*